(12) United States Patent
Brabec et al.

(10) Patent No.: US 8,158,881 B2
(45) Date of Patent: Apr. 17, 2012

(54) TANDEM PHOTOVOLTAIC CELLS

(75) Inventors: Christoph Brabec, Linz (AT); Russell Gaudiana, Merrimack, NH (US); Christoph Waldauf, Innsbruck (AT)

(73) Assignee: Konarka Technologies, Inc., Lowell, MA (US)

( * ) Notice: Subject to any disclaimer, the term of this patent is extended or adjusted under 35 U.S.C. 154(b) by 62 days.

(21) Appl. No.: 11/734,093

(22) Filed: Apr. 11, 2007

(65) Prior Publication Data

US 2007/0246094 A1 Oct. 25, 2007

Related U.S. Application Data

(63) Continuation-in-part of application No. 11/643,271, filed on Dec. 21, 2006, and a continuation-in-part of application No. 11/486,536, filed on Jul. 14, 2006, which is a continuation-in-part of application No. 11/450,521, filed on Jun. 9, 2006, which is a continuation-in-part of application No. 11/375,643, filed on Mar. 14, 2006, application No. 11/734,093, which is a continuation-in-part of application No. 11/485,708, filed on Jul. 13, 2006, which is a continuation-in-part of application No. 11/450,521, filed on Jun. 9, 2006, which is a continuation-in-part of application No. 11/375,643, filed on Mar. 14, 2006.

(60) Provisional application No. 60/699,123, filed on Jul. 14, 2005, provisional application No. 60/790,606, filed on Apr. 11, 2006, provisional application No. 60/792,485, filed on Apr. 17, 2006, provisional application No. 60/792,635, filed on Apr. 17, 2006, provisional application No. 60/793,442, filed on Apr. 20, 2006, provisional application No. 60/795,103, filed on Apr. 26, 2006, provisional application No. 60/797,881, filed on May 5, 2006, provisional application No. 60/798,258, filed on May 5, 2006, provisional application No. 60/850,963, filed on Oct. 11, 2006, provisional application No. 60/850,845, filed on Oct. 11, 2006, provisional application No. 60/888,704, filed on Feb. 7, 2007.

(51) Int. Cl.
*H01L 31/042* (2006.01)

(52) U.S. Cl. ........................................ 136/263; 136/244

(58) Field of Classification Search ........... 136/242–265
See application file for complete search history.

(56) References Cited

U.S. PATENT DOCUMENTS

| 4,292,092 A | 9/1981 | Hanak |
| 4,416,959 A | 11/1983 | Skotheim |

(Continued)

FOREIGN PATENT DOCUMENTS

DE 31 21 350 7/1982

(Continued)

OTHER PUBLICATIONS

Van Duren, J.K.J., Dhanabalan, A., Van Hal, P.A., Janssen, R.A.J. Low-bandgap Polymer Photovoltaic Cells. 2001, Synthetic Metals, 121, pp. 1587-1588.*

(Continued)

*Primary Examiner* — Keith Hendricks
*Assistant Examiner* — Bach Dinh
(74) *Attorney, Agent, or Firm* — Fish & Richardson P.C.

(57) ABSTRACT

Tandem photovoltaic cells, as well as related components, systems, and methods, are disclosed.

46 Claims, 5 Drawing Sheets

U.S. PATENT DOCUMENTS

| | | | |
|---|---|---|---|
| 4,574,160 A | 3/1986 | Cull et al. | |
| 4,639,328 A | 1/1987 | Krause et al. | |
| 4,686,323 A | 8/1987 | Biter et al. | |
| 4,746,618 A | 5/1988 | Nath et al. | |
| 4,795,687 A | 1/1989 | Suzuki et al. | |
| 4,913,744 A | 4/1990 | Hoegl et al. | |
| 4,948,436 A | 8/1990 | Juergens | |
| 5,071,490 A | 12/1991 | Yokota et al. | |
| 5,221,363 A | 6/1993 | Gillard | |
| 5,274,058 A | 12/1993 | Ferraris et al. | |
| 5,510,438 A | 4/1996 | Ferraris et al. | |
| 5,536,808 A | 7/1996 | Curtis et al. | |
| 5,708,130 A | 1/1998 | Woo et al. | |
| 6,109,330 A | 8/2000 | Crisp | |
| 6,132,585 A | 10/2000 | Midorikawa et al. | |
| 6,188,175 B1 | 2/2001 | May et al. | |
| 6,198,091 B1 | 3/2001 | Forrest et al. | |
| 6,198,092 B1 | 3/2001 | Bulovic et al. | |
| 6,239,355 B1 | 5/2001 | Salafsky | |
| 6,278,055 B1 | 8/2001 | Forrest et al. | |
| 6,297,495 B1 | 10/2001 | Bulovic et al. | |
| 6,333,458 B1 | 12/2001 | Forrest et al. | |
| 6,352,777 B1 | 3/2002 | Bulovic et al. | |
| 6,353,083 B1 | 3/2002 | Inbasekaran et al. | |
| 6,399,224 B1 | 6/2002 | Li | |
| 6,440,769 B2 | 8/2002 | Peumans et al. | |
| 6,451,415 B1 | 9/2002 | Forrest et al. | |
| 6,464,762 B1 * | 10/2002 | Arao | 106/1.22 |
| 6,580,027 B2 * | 6/2003 | Forrest et al. | 136/263 |
| 6,657,378 B2 | 12/2003 | Forrest et al. | |
| 6,772,817 B2 | 8/2004 | Lai et al. | |
| 6,818,260 B2 | 11/2004 | Farrand et al. | |
| 6,864,333 B2 | 3/2005 | Dall'Occo et al. | |
| 7,095,044 B2 | 8/2006 | Brown et al. | |
| 7,105,237 B2 | 9/2006 | Sotzing | |
| 7,196,366 B2 * | 3/2007 | Forrest et al. | 257/293 |
| 7,309,833 B2 | 12/2007 | Robeson et al. | |
| 7,368,510 B2 | 5/2008 | Lee et al. | |
| 7,405,775 B2 | 7/2008 | Nilsson | |
| 2002/0040728 A1 | 4/2002 | Yoshikawa | |
| 2002/0050289 A1 | 5/2002 | Wada et al. | |
| 2002/0105005 A1 | 8/2002 | Seo et al. | |
| 2003/0008172 A1 | 1/2003 | Leclerc et al. | |
| 2003/0023029 A1 | 1/2003 | Wang et al. | |
| 2003/0036612 A1 | 2/2003 | Nifant'ev et al. | |
| 2003/0042471 A1 | 3/2003 | Giles et al. | |
| 2003/0102024 A1 | 6/2003 | Zeira | |
| 2003/0127967 A1 | 7/2003 | Tsutsui et al. | |
| 2003/0159729 A1 | 8/2003 | Shaheen et al. | |
| 2003/0175411 A1 | 9/2003 | Kodas et al. | |
| 2003/0188777 A1 * | 10/2003 | Gaudiana et al. | 136/263 |
| 2003/0189402 A1 | 10/2003 | Gaudiana et al. | |
| 2003/0230335 A1 * | 12/2003 | Tsukahara | 136/252 |
| 2004/0118448 A1 | 6/2004 | Scher et al. | |
| 2004/0187911 A1 * | 9/2004 | Gaudiana et al. | 136/252 |
| 2004/0192871 A1 | 9/2004 | Wang et al. | |
| 2004/0201018 A1 | 10/2004 | Yamahara et al. | |
| 2004/0256615 A1 | 12/2004 | Sirringhaus et al. | |
| 2005/0022865 A1 * | 2/2005 | Robeson et al. | 136/263 |
| 2005/0124784 A1 | 6/2005 | Sotzing | |
| 2005/0145972 A1 * | 7/2005 | Fukuda et al. | 257/458 |
| 2005/0194038 A1 | 9/2005 | Brabec et al. | |
| 2005/0224905 A1 * | 10/2005 | Forrest et al. | 257/461 |
| 2006/0022192 A1 | 2/2006 | Brabec et al. | |
| 2006/0027834 A1 | 2/2006 | Forrest et al. | |
| 2006/0076050 A1 | 4/2006 | Williams et al. | |
| 2006/0147748 A1 | 7/2006 | Ko | |
| 2006/0155106 A1 | 7/2006 | Roberts et al. | |
| 2007/0014939 A1 | 1/2007 | Gaudiana et al. | |
| 2007/0017571 A1 | 1/2007 | Gaudiana et al. | |
| 2007/0020526 A1 | 1/2007 | Gaudiana et al. | |
| 2007/0120045 A1 | 5/2007 | Yokoyama | |
| 2007/0158620 A1 | 7/2007 | Gaudiana et al. | |
| 2007/0181179 A1 | 8/2007 | Brabec et al. | |
| 2007/0193621 A1 | 8/2007 | Brabec et al. | |
| 2007/0282094 A1 * | 12/2007 | Marks et al. | 528/377 |
| 2008/0053518 A1 | 3/2008 | Chang et al. | |
| 2008/0164460 A1 | 7/2008 | Oyamada et al. | |
| 2008/0264488 A1 | 10/2008 | Balasubramanian | |

FOREIGN PATENT DOCUMENTS

| | | |
|---|---|---|
| DE | 3121350 | 7/1982 |
| DE | 103 26 547 | 1/2005 |
| DE | 69330835 | 2/2007 |
| EP | 0251598 | 6/1987 |
| EP | 0 251 598 | 1/1988 |
| EP | 1 065 725 | 1/2001 |
| EP | 1 318 553 | 6/2003 |
| EP | 1318553 | 6/2003 |
| EP | 1507298 | 2/2005 |
| EP | 1 562 154 | 8/2005 |
| JP | 04-192376 | 7/1992 |
| JP | 2001 060707 | 3/2001 |
| JP | 2002-141524 | 5/2002 |
| JP | 03-073382 | 3/2003 |
| JP | 2003-515933 | 5/2003 |
| JP | 2003 264085 | 9/2003 |
| JP | 04-534863 | 6/2004 |
| JP | 05-011841 | 1/2005 |
| JP | 06-166746 | 6/2006 |
| JP | 06-278682 | 10/2006 |
| KR | 100685796 | 2/2007 |
| WO | WO 93/05077 | 3/1993 |
| WO | WO 94/14199 | 6/1994 |
| WO | WO 97/05184 | 2/1997 |
| WO | 00/22682 | 4/2000 |
| WO | WO 00/46321 | 8/2000 |
| WO | WO 01/39276 | 5/2001 |
| WO | 00/11725 | 3/2002 |
| WO | WO 02/059121 | 8/2002 |
| WO | 02/101838 | 12/2002 |
| WO | WO03/065462 * | 8/2003 |
| WO | WO 03/065462 | 8/2003 |
| WO | WO 2004/042824 | 5/2004 |
| WO | WO 2005/111045 | 5/2004 |
| WO | WO 2005/092947 | 10/2005 |
| WO | WO 2007/011739 | 1/2007 |
| WO | WO2007022226 | 2/2007 |
| WO | WO 2007/076427 | 7/2007 |
| WO | WO 2007/121252 | 10/2007 |
| WO | WO 2007/133705 | 11/2007 |
| WO | WO 2007/145482 | 12/2007 |
| WO | WO 2008/000664 | 1/2008 |
| WO | WO 2010/008672 | 1/2010 |

OTHER PUBLICATIONS

Roman, L. S., Mammo, W., Petterson, L. A. A., Anderson, M., Inganas, O., High Quantum Efficiency Polythiophene/C60 Photodiodes, 1998, Advanced Materials, 10, 774-777.*

Bjorstrom et al., "Multilayer formation in spin-coated thin films of low-bandgap polyfluorene:PCBM blends," J. Phys. Condens. Matter 17:L529-L534, 2005.

Hiramoto et al., "Effect if Think Gold Interstitial-layer on the Photovoltaic Properties of Tandem Organic Solar Cell," *Chemistry Letters*, The Chemistry Society of Japan, pp. 327-330, 1990.

Greenham et al., "Charge separation and transport in conjugated polymer/cadmium selenide nanocrystal composites studied by photoluminescence quenching and photoconductivity," Synthetic Metals, 84:545-546, 1997.

Yakimov et al., "High photovoltage multiple-heterojunction organic solar cells incorporating interfacial metallic nanoclusters," Applied Physics Letters, vol. 80, No. 9, Mar. 2002.

Drechsel et al., "High efficiency organic solar cells based on single or multiple PIN structures," Thin Solid Films, vol. 451-452:515-517, 2004.

Hiramoto et al., "Design of nanostructures for photoelectric conversion using an organic vertical superlattice," Appl. Phys. Letters, 88:213105, 2006.

Takamoto et al., "Two-Terminal Monolithic Ino.5Gao.5P/GaAs Tandem Solar Cells with a High Conversion Efficiency of Over 30%," Jap. J. Appl. Physics, 36(10):6215-6220.

Umeda et al., "Fabrication of Interpenetrating Semilayered Structure of Conducting Polymer and Fullerene by Solvent Corrosion Method and Its Photovoltaic Properties," Jap. J. Appl. Physics, 44(6A):4155-4160, 2005.

Yamaguchi et al., "Multi-junction III-V solar cells: current status and future potential," Solar Energy, 79(1):78-85, 2005.

Xue, et al., "Asymmetric tandem organic photovoltaic cells with hybrid planar-mixed molecular heterojunctions," Appl. Phys. Letters, 85(23):5757-5759, 2004.

Ando et al., "Synthesis, physical properties, and field-effect transistors of novel thiophene/thiazolothiazole co-oligomers," J. Mater. Chem., vol. 14, 1787-1790, 2004.

Asawapirom et al., "Dialkylcyclopentadithiophene Polymers and Copolymers," Macromolecular Rapid Communications, 22:746-749, 2001.

Bakhshi et al., "Strategies for Molecular Designing of Novel Low-Band-Gap Electrically Conducting Polymers," Applied Biochemistry and Biotechnology, 96:125-133, 2001.

Bakhshi et al., "Electronic Structures of Donor-Acceptor Polymers Based on Polythiophene, Polyfuran and Polypyrrole," Molecular Engineering, 6:239-248, 1996.

Bakhshi et al., "Ab initio study of the electronic structures and conduction properties of some donor-acceptor polymers and their copolymers," Journal of Chemical Physics, 119:13159-13169, 2003.

Baumgartner, "π-Conjugated Heterocyclic fused Bithiophene Materials," J. Inorganic and Organometallic Polymers and Materials, 15(4):389-409, 2005.

Berlin et al., "Self-assembly of mono- and multilayers of polyconjugated conducting polymers," Macromolecular Rapid Communications, 21:301-318, 2000.

Berlin et al., "Thiophene/Cyclopentadiene Regular Copolymers from Electrochemical Oxidation of Dithienylcyclopentadienes," Macromolecular Chemistry and Physics, 203:1228-1237, 2002.

Coppo et al., "Cyclopentadithiophene based electroactive materials," J Mater. Chem., 15:1123-1133, 2005.

Coppo et al., "Investigation of the electronic properties of cyclopentadithiophene polymers and copolymers," Mat. Res. Soc. Symp. Proc., 771:L4.9.1-L4.9.4, 2003.

Coppo et al., "New routes to poly(4,4-dialkylcyclopentadithiophene-2,6-diyls)," J Mater. Chem., 12:2597-2599, 2002.

Coppo et al., "Synthesis, solid state structure and polymerisation of a fully planar cyclopentadithiophene," Chem. Commun., 2548-2549, 2003.

Coppo et al., "Synthetic Routes to Solution-Processable Polycyclopentadithiophenes," Macromolecules, 35:2705-2711, 2003.

Cravino et al., "Nanostructured Bipolar Organic Polymers," Encyclopedia of Nanoscience and Nanotechnology, 7:615-628.

Cravino et al., "Double-cable polymers for fullerene based organic optoelectronic applications," J. Mater. Chem., 12:1931-1943, 2002.

Dai, "Conjugated and Fullerene-Containing Polymers for Electronic and Photonic Applications: Advanced Syntheses and Microlithographic Fabrications," Journal of Macromolecular Science, Part C—Reviews in Macromolecular Chemistry and Physics, 39:273-387, 1999.

Gadisa et al., "Improvements of fill factor in solar cells based on blends of polyfluorene copolymers as electron donors," Thin Solid Films, 515:3126-3131, (2007).

Huang et al., "In-situ conductivity of a low band-gap conducting polymer. Measurement of intrinsic Conductivity," Acta Polymerica, vol. 48(10), (1997).

Huang et al., "A Donor-Acceptor Conducting Copolymer with a Very Low Band Gap and High Intrinsic Conductivity," Chem. Mater., vol. 10, No. 8, pp. 2212-2216, (1998).

Huang et al., "Oxygen-Modified Poly(4-dicyanomethylene-4H-cyclopenta[2,1-b;3,4-b]dithiophene: A Tunable Low band Gap Polymer," Chem. Mater., vol. 11, No. 6, pp. 1541-1545, (1999).

Jespersen et al., "The electronic states of polyfluorene copolymers with alternating donor-acceptor units," J. Chem. Phy., 121(24):12613-12617, 2004.

Kim et al., "Influence of electron-donating polymer addition on the performance of polymer solar cells," J. Phys. D: Appl. Phys., 41:1-5, (2008).

Ko et al., "Electrochemistry and electrochromism of a poly(cyclopentadithiophene) derivative with a viologa pendant," Electrochimica Acta. vol. 48, pp. 4127-4135, (2003).

Kunugi et al., "Charge transport in a regioregular poly(3-octylthiophene) film," J. Mater. Chem., 10:2673-2677, 2000.

Larmat et al., "Comparative Reactivity of Thiophene and 3,4-(Ethylenedioxy) thiophene as Terminal Electropolymerizable Units in Bis-Heterocycle Arylenes," Journal of Polymer Science: Part A: Polymer Chemistry, 35:3627-3636, 1997.

Muhlbacher et al., "High Photovoltaic Performance of a Low-Bandgap Polymer," Adv. Mater., 18:2884-2889, 2006.

Ohshita et al., "Synthesis of Polymers Composed of Alternating Diphenylenedithienosilole and Diethynylenesilyene Units and Their Applications to Hole Transport in Double-Layer EL Devices" Macromolecules, vol. 33, pp. 8890-8893, 2000. Entire document, especially Scheme 1, p. 8890; Table 2.

Plater et al., "Cyclopenta-1,2,3-dithiazoles and related compounds," J. Chem.. Soc., Perkin Trans. 1, Issue 7, 769-774, 1993. Abstract.

Prato, "Fullerene Materials," Topics in Current Chemistry, 199:173-187, 1999.

Roncali, "Linear π-conjugated systems with tailored electronic properties," Annu. Rep. Prog. Chem., Sect. C, 95:47-88, 1999.

Roncali, "Linear π-conjugated systems derivatized with $C_{60}$-fullerene as molecular heterojunctions for organic photovoltaics," Chem. Soc. Rev., 34:483-495, 2005.

Scherf et al., "Semiconducting Polyfluorenes—Towards Reliable Structure—Property Relationships," Advanced Materials, 14:477-487, 2002.

Sensfuss et al., Characterisation of potential donor acceptor pairs for polymer solar cells by ESR, optical and electrochemical investigations, vol. 5215, Proc. of SPIE129-140, 2004.

Subramanian et al., "Trends in Geometric and Electronic Properties of Thiophene- and Cyclopentadiene-Based Polymers," International Journal of Quantum Chemistry, 66:229-240, 1998.

Usta et al., "Dithienosilole- and Dibenzosilole- Thiophene Copolymers as Semiconductors for Organic Thin-Film Transistors," J. Am. Chem., 128:9034-9035, 2006.

Wang et al., "Conjugated Fluorene and Silole Copolymers: Synthesis, Characterization, Electronic Transition, Light Emission, Photovoltaic Cell, and Field Effect Hole Mobility," Macromolecules, 38:2253-2260, 2005.

Winder et al., "Sensitization of low bandgap polymer bulk heterojunction solar cells," Thin Solid Films, 403-404:373-379, (2002).

Wong et al., "Efficient photovoltaic cells with wide photosensitization range fabricated from rhenium benzathiazole complexes," App. Phys. Letters, 90:1-3, (2007).

Wu et al., "Low band gap-conjugated polymer derivatives," Synthetic Metals. vol. 155, pp. 618-622 (2005).

Yonezawa et al., "Preparation and properties of oligomers containing cyclopentadithiophene," Synthetic Metals, 119:99-100, 2001.

Yoon et al., "Organic Thin-Film Transistors Based on Carbonyl-Functionalized Quaterthiophenes: High Mobility N-Channel Semiconductors and Ambipolar Transport," J. Am. Chem. Soc. vol. 127, pp. 1348-1349, (2005).

Zotti et al., "Polymers, Dimers and Radical Cations from Electrochemical Oxidation of Interring-Bridged Thiophene and Thiophene-Phenylene Tetramers," Macromolecular Chemistry and Physics, 202:3049-3056, 2001.

Zotti et al., "Novel, Highly Conducting, and Soluble Polymers from Anodic Coupling of Alkyl-Substituted Cyclopentadithiophene Monomers," Macromolecules, 27:1938-1942, 1994.

Zhu et al., "Panchromatic Conjugated Polymers Containing Alternation Donor/Acceptor Units for Photovoltaic Applications," 40:1981-1986, 2007.

Liao et al., "Photovoltaic Dithienosilole-Containing Polymers," Macromoleculs, vol. 40, pp. 9406-9412 (2007).

Arias, et al., Vertically segregated polymer-blend photovoltaic thin-film structures through surface-mediated solution processing, applied physics letters, vol. 80, No. 10 Mar. 11, 2002.

Higgins, et al., "Surface segregation and self-stratification in blends of spin-cast polyfluorene derivatives", J. Phys.: Condens. Matter 17 (2005) 1319-1328.

Kim, et al., "Distinct Annealing Temperature in Polymer:Fullerene:Polymer Ternary Blend Solar Cells", J. Phys. Chem. C, 2009, 113 (4), 1620-1623 DOI: 10.1021/jp809589n, Publication Date (Web): Jan. 5, 2009.

Hu, W. and Matsumura, M., "Structure and thickness dependence of p-n heterojunction solar cells based on copper phthalocyanine and perylene pigments", *Institute of Physics Publishing Journal of Physics D: Applied Physics*, J. Phys. D: Appl. Phys., 37:1434-1438 (2004).

Peumans et al., "Efficient photon harvesting at high optical intensities in ultrathin organic double-heterostructure photovoltaic diodes", *American Institute of Physics*, Applied Physics Letter, 76(19):2650-2652 (2000).

Swager et al., "The molecular wire approach to sensory signal amplifiers," Acc. Chem. Res., 1998, 31, 201-207.

Zhou et al., "Fluorene based low band gap copolymers for photovoltaic devices," Applied Physics Letters, vol. 84, No. 10, 1653-1655, Mar. 8, 2004.

Jiangeng Xue, et al., "A Hybrid Planar-Mixed Molecular Heterojunction Photovoltaic Cell", Adv. Mater. 2005, 17, No. 1 Jan. 6.

Pankaj Kumar, et al.. "Effect of Active Layer Thickness on Open Circuit Voltage in Organic Photovoltaic Devices", Japanese Journal of Applied Physics 48 (2009) 121501.

P. Peumans, "Efficient photon harvesting at high optical intensities in ultrathin organic double-heterostructure photovoltaic diodes", Applied Physics Letters, vol. 76, No. 19, May 8, 2000.

Wenping Hu, et al. "Structure and thickness dependence of p-n heterojunction solar cells based on copper hthalocyanine and perylene pigments", J. Phys. D: Appl. Phys. 37 (2004) 1434-1438.

Benoit Brousse, et al., Vapour deposited solar cells based on CuPc-C60 single heterojunction: optimization of the deposition process, Synthetic Metals 147 (2004) 293-298.

Ahmed, et al. "Benzobisthiazole-Thiophene Copolymer Semiconductors: Synthesis, Enhanced Stability, Field-Effect Transistors, and Efficient Solar Cells", Macromolecules 2009, 42, 8615-8618.

Ando, et al., "Characterization and Field-Effect Transistor Performance of Heterocyclic Oligomers Containing a Thiazolothiazole Unit", Chemistry Letter vol. 33, No. (2004).

Chen, et al., "Polymer solar cells with enhanced open-circuit voltage and efficiency", Nature Photonics, vol. 3, Nov. 2009.

European Search Report dated Nov. 10, 2010, Application No. 10177632.6.

Gao, et al., "Efficient photodetectors and photovoltaic cells from composites of fullerenes and conjugated polymers: photoinduced electron transfer", Synthetic Metals 84 (1997) 979-980.

Hou, et al., "Synthesis, Characterization, and Photovoltaic Properties of a Low Band Gap Polymer Based on Silole-Containing Polythiophenes and 2, 1, 3-Benzothiadiazole", J. Am. Chem. Soc. 2008, 130, 16144-16145.

Hou, et al. "Bandgap and Molecular Energy Level Control of Conjugated Polymer Photovoltaic Materials Based on Benzo[1,2-*b*:4,5-*b*']dithiophene", Macromolecules 2008, 41, 6012-6018.

Li, et al. "High-efficiency solution processable polymer photovoltaic cells by self-organization of polymer blends", Nature Materials vol. 4, Nov. 2005.

Li, et al., "Plastic Solar Cells", Nature Mater. 4 864 (2005).

Maksudul, et al., "Polybenzobisazoles Are Efficient Electron Transport Materials for Improving the Performance and Stability of Polymer Light-Emitting Diodes", Chem. Mater. 2002, 14, 4775-4780.

Mike, et al. "Facile Synthesis of 2, 6-Disubstituted Benzobisthiazoles: Functional Monomers for the Design of Organic Semiconductors", J. Org. Chem. 2010, 75, 495-497.

Mike, et al., An Efficient Synthesis of 2, 6-Disubstituted Benzobisoxazoles: New Building Blocks for Organic Semiconductors, Org. Lett., vol. 10, No. 21, 2008.

Mike, et al., "Synthesis and Characterization of Dialkoxy Substituted Poly(phenylenevinylene) Benzobisoxazoles", Rapid Communication, J. Polym.. Sci. Part A: Polym. Chem.: vol. 48 (2010).

Niu, Applied Physics Letters, 2003, vol. 82, No. 13, 2163-2165.

Osahen, et al., "Electroactive and Photoactive Rod-Coil Copolymers: Design, Synthesis, and Supramolecular Regulation of Photophysical Properties", J. Am. Chem. SOC. 1995,117, 7389-7398.

Osaka, et al., "Novel Thiophene-Thiazolothiazole Copolymers for Organic Field-Effect Transistors", Adv. Mater. 2007, 19, 4160-4165.

Osaka, et al., High-Lamellar Ordering and Amorphous-Like π-Network in Short-Chain Thiazolothiazole-Thiophene Copolymers Lead to High Mobilities', J. AM. Chem. Soc. 2009, 131, 2521-2529.

So, et al., "Synethesis and Photophysical Properties of Some Benzoxazole and Benzothiazole Compounds", Macromolecules 1996, 29, 2784-2795.

Zhang, et al., "Polymer Solar Cells Based on a Low-Bandgap Fluorene Copolymer and a Fullerene Derivative with Photocurrent Extended to 850 nm", Adv. Funct. Mater. 2005, 15, No. 5, May.

International Search Report dated Apr. 3, 2010, PCT/US2010/026222.

Liu et al., "Efficient green-light-emitting diodes from silole-containing copolymers", 15, 3496-3500 (2003).

Peet et al., "Efficiency enhancement in low-bandgap polymer solar cells by processing with alkane dithiol", Nat. Mat., 6:497-500, 2007.

Peng et al. "Synthesis and electroluminescent properties of copolymers based on fluorine and 2,5-di(2-hexyloxypheny) thiazologhiazole" Macromolecules 38, 7292-7298 (2005).

Shrotriya, V., "Plastic Solar Cells", Organic Semiconductor Conference, 1-33 (2009).

Barbarella et al., "Oligothiophene-S, S dioxides: a New Class of Thiophene based Materials", Journal of Organic Chemistry, Optical Materials 9 (1998) 43-45.

European Search Report dated Feb. 24, 2011, Application No. 10177632.6.

International Preliminary Report on Patentability dated Feb. 8, 2011 issued in PCT/US2009/049701.

Jayakanna, et al., "Synthesis and Structure-Property Relationship of New Donor-Acceptor-Type Conjugated Monomers on the Basis of Thiophene and Benzothiadiazole", Journal of Polymer Science Part A: Polymer Chemistry, vol. 40, 251-261 (2002).

Kunai et al., "Synthesis and properties of silicon-bridged bithiophenes and application to EL devices," Synthetic Metals, Elsevier Sequoia Lausanne, CH, vol. 137, No. 1-3, Jan. 1, 2003, pp. 1007-1008.

Supplemental European Search Report dated Mar. 4, 2011, Application No. 07872313.7.

Supplemental European Search Report dated Mar. 4, 2011, Application No. 06787321.6.

Kong et al. "Single-Walled Carbon Nanotube Gold Nanohybrids: Application in Highly Effective Transparent and Conductive Films", J. Phys. Chem. C 2007, 111, p. 8377-8382.

\* cited by examiner

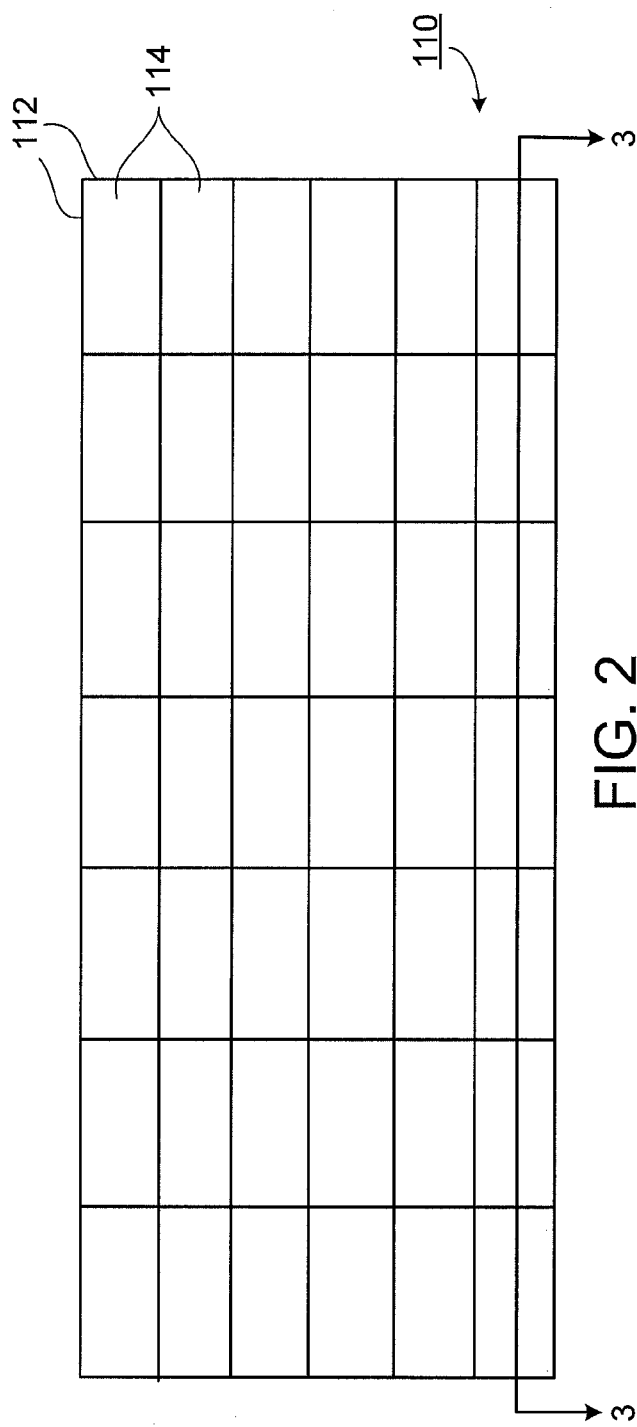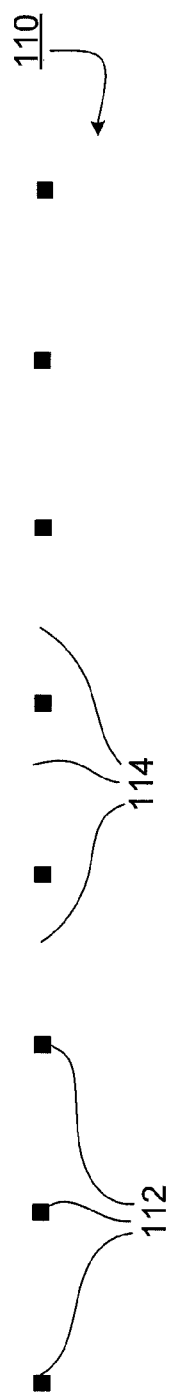

TANDEM PHOTOVOLTAIC CELLS

CROSS REFERENCE TO RELATED APPLICATIONS

This application is a continuation-in-part of and claims priority under 35 U.S.C §120 to U.S. patent application Ser. No. 11/643,271, filed Dec. 21, 2006.

This application is also a continuation-in-part of and claims priority under 35 U.S.C §120 to U.S. Utility application Ser. No. 11/486,536, filed Jul. 14, 2006, which in turn is a continuation-in-part of U.S. Utility application Ser. No. 11/450,521, filed Jun. 9, 2006, which in turn is a continuation-in-part of U.S. Utility application Ser. No. 11/375,643, filed Mar. 14, 2006, which in turn claims priority under 35 U.S.C. §119 to U.S. Provisional Application Ser. No. 60/699,123, filed Jul. 14, 2005.

This application is also a continuation-in-part of and claims priority under 35 U.S.C §120 U.S. Utility application Ser. No. 11/485,708, filed Jul. 13, 2006, which in turn is a continuation-in-part of U.S. Utility application Ser. No. 11/450,521, filed Jun. 9, 2006, which in turn is a continuation-in-part of U.S. Utility application Ser. No. 11/375,643, filed Mar. 14, 2006, which claims priority to U.S. Provisional Application Ser. No. 60/699,123, filed Jul. 14, 2005

This application also claims priority under 35 U.S.C. §119 to U.S. Provisional Application Ser. No. 60/790,606, filed Apr. 11, 2006, U.S. Provisional Application Ser. No. 60/792,485, filed Apr. 17, 2006, U.S. Provisional Application Ser. No. 60/792,635, filed Apr. 17, 2006, U.S. Provisional Application Ser. No. 60/793,442, filed Apr. 20, 2006, U.S. Provisional Application Ser. No. 60/795,103, filed Apr. 26, 2006, U.S. Provisional Application Ser. No. 60/797,881, filed May 5, 2006, U.S. Provisional Application Ser. No. 60/798,258, filed May 5, 2006, U.S. Provisional Application Ser. No. 60/850,963, filed Oct. 11, 2006, U.S. Provisional Application Ser. No. 60/850,845, filed Oct. 11, 2006, and U.S. Provisional Application Ser. No. 60/888,704, filed Feb. 7, 2007.

The contents of all of these applications are hereby incorporated by reference.

TECHNICAL FIELD

This invention relates to tandem photovoltaic cells, as well as related components, systems, and methods.

BACKGROUND

Photovoltaic cells are commonly used to transfer energy in the form of light into energy in the form of electricity. A typical photovoltaic cell includes a photoactive material disposed between two electrodes. Generally, light passes through one or both of the electrodes to interact with the photoactive material to generate electricity. As a result, the ability of one or both of the electrodes to transmit light (e.g., light at one or more wavelengths absorbed by a photoactive material) can limit the overall efficiency of a photovoltaic cell. In many photovoltaic cells, a film of semiconductive material (e.g., indium tin oxide) is used to form the electrode(s) through which light passes because, although the semiconductive material may have a lower electrical conductivity than electrically conductive materials, the semiconductive material can transmit more light than many electrically conductive materials.

SUMMARY

This invention relates to tandem photovoltaic cells, as well as related components, systems, and methods.

In one aspect, the invention features a system that includes first and second electrodes, a recombination layer between the first and second electrodes, a first photoactive layer between the first electrode and the recombination layer, and a second photoactive layer between the second electrode and the recombination layer. The recombination layer includes third, fourth, and fifth layers. The fifth layer is between the third and fourth layers. The system is configured as a photovoltaic system.

In another aspect, the invention features a system that includes first and second electrodes, a first photoactive layer between the first and second electrodes, a second photoactive layer between the second electrode and the first photoactive layer, and third, fourth, and fifth layers between the first and second photoactive layers. The fifth layer is between the third and fourth layers. The third, fourth, and fifth layers are configured such that, during use, electrons generated in one of the first and second photoactive layers and holes generated in the other of the first and second photoactive layers are recombined at the fifth layer. The system is configured as a photovoltaic system.

In another aspect, the invention features a system that includes first and second electrodes, a first photoactive layer between the first and second electrodes, and a second photoactive layer between the second electrode and the first photoactive layer. At least one of the first and second photoactive layers includes a polymer containing a first comonomer repeat unit and a second comonomer repeat unit different from the first comonomer repeat unit. The first comonomer repeat unit includes a cyclopentadithiophene moiety. The system is configured as a tandem photovoltaic cell.

In another aspect, the invention features a system that includes first and second electrodes, a first photoactive layer between the first and second electrodes, and a second photoactive layer between the second electrode and the first photoactive layer. At least one of the first and second photoactive layers includes a polymer containing a first comonomer repeat unit and a second comonomer repeat unit different from the first comonomer repeat unit. The first comonomer repeat unit includes a silacyclopentadithiophene moiety. The system is configured as a tandem photovoltaic cell.

In another aspect, the invention features a system that includes first and second electrodes, a first photoactive layer between the first and second electrodes, and a second photoactive layer between the second electrode and the first photoactive layer. At least one of the first and second photoactive layers includes a polymer containing a first comonomer repeat unit and a second comonomer repeat unit different from the first comonomer repeat unit. The first comonomer repeat unit includes a cyclopentadithiophene moiety. The system is configured as a photovoltaic system.

In another aspect, the invention features a system that includes first and second electrodes, a first photoactive layer between the first and second electrodes, and a second photoactive layer between the second electrode and the first photoactive layer. At least one of the first and second photoactive layers includes a polymer containing a first comonomer repeat unit and a second comonomer repeat unit different from the first comonomer repeat unit. The first comonomer repeat unit includes a silacyclopentadithiophene moiety. The system is configured as a photovoltaic system.

In another aspect, the invention features a method that includes disposing a first photoactive layer on a substrate, disposing a second photoactive layer on the first photoactive layer, and disposing the first and second photoactive layers between two electrodes to form a photovoltaic system. The first photoactive layer includes an organic electron donor material and an organic electron acceptor material. The second photoactive layer includes an inorganic semiconductor material. At least one of the first and second photoactive layers is disposed via a first liquid-based coating process.

In still another aspect, this invention features a system that includes first and second electrodes, and first and second photoactive layers between the first and second electrodes. The first photoactive layer includes an organic electron donor material and an organic electron acceptor material. The second photoactive layer includes an inorganic semiconductor material. The system is configured as a photovoltaic system.

Embodiments can include one or more of the following features.

In some embodiments, the fifth layer includes a metal oxide. For example, the metal oxide can include an oxide selected from the group consisting of titanium oxides, indium tin oxides, tin oxides, zinc oxides, and combinations thereof. In certain embodiments, the fifth layer comprises metallic particles.

In some embodiments, the third layer includes an n-type semiconductor material and the fourth layer includes a p-type semiconductor material.

In some embodiments, the p-type semiconductor material includes a polymer. The polymer can be selected from the group consisting of polythiophenes (e.g., poly(3,4-ethylene dioxythiophene) (PEDOT)), polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxalines, polybenzoisothiazoles, polybenzothiazoles, polythienothiophenes, poly(thienothiophene oxide)s, polydithienothiophenes, poly(dithienothiophene oxide)s, polytetrahydroisoindoles, and copolymers thereof.

In some embodiments, the p-type semiconductor material includes a metal oxide. For example, the metal oxide can include an oxide selected from the group consisting of copper oxides, strontium copper oxides, strontium titanium oxides, and combinations thereof. In certain embodiments, the p-type semiconductor material includes a p-doped metal oxide (e.g., p-doped zinc oxides or p-doped titanium oxides).

In some embodiments, the n-type semiconductor material includes a metal oxide. For example, the metal oxide can include an oxide selected from the group consisting of titanium oxides, zinc oxides, tungsten oxides, molybdenum oxides, and combinations thereof. In other embodiments, the n-type semiconductor material includes a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof.

In some embodiments, the third layer is between the first photoactive layer and the fifth layer.

In some embodiments, the system further includes a hole carrier layer between the first photoactive layer and the first electrode. The hole carrier layer can include a polymer selected from the group consisting of polythiophenes (e.g., PEDOT), polyanilines, polyvinylcarbazoles, polyphenylenes, polyphenylvinylenes, polysilanes, polythienylenevinylenes, polyisothianaphthanenes, and copolymers thereof.

In some embodiments, the system further includes a hole blocking layer between the second photoactive layer and the second electrode. The hole blocking layer can include a material selected from the group consisting of LiF, metal oxides (e.g., a titanium oxide or a zinc oxide), and combinations thereof.

In some embodiments, the fifth layer includes a semiconductive material or an electrically conductive material.

In some embodiments, the first or second photoactive layer includes an electron donor material and an electron acceptor material.

In some embodiments, the electron donor material includes a polymer selected from the group consisting of polythiophenes, polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly(dithienothiophene oxide)s, polytetrahydroisoindoles, and copolymers thereof. For example, the electron donor material can include a polymer selected from the group consisting of polythiophenes (e.g., poly(3-hexylthiophene) (P3HT)), polycyclopentadithiophenes (e.g., poly(cyclopentadithiophene-co-benzothiadiazole)), and copolymers thereof.

In some embodiments, the electron acceptor material includes a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof. For example, the electron acceptor material can include a substituted fullerene (e.g., C61-phenyl-butyric acid methyl ester (PCBM)).

In some embodiments, the first photoactive layer has a first band gap and the second photoactive layer has a second band gap different from the first band gap.

In some embodiments, at least one of the first and second electrodes includes a mesh electrode.

In some embodiments, the system includes a tandem photovoltaic cell.

In some embodiments, the cyclopentadithiophene or silacyclopentadithiophene moiety is substituted with at least one substituent selected from the group consisting of $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, and $SO_2R$; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. For example, the cyclopentadithiophene or silacyclopentadithiophene moiety is substituted with hexyl, 2-ethylhexyl, or 3,7-dimethyloctyl. In certain embodiments, the cyclopentadithiophene or silacyclopentadithiophene moiety is substituted at 4-position.

In some embodiments, the first comonomer repeat unit includes a cyclopentadithiophene moiety of formula (1) or a silacyclopentadithiophene moiety of formula (29):

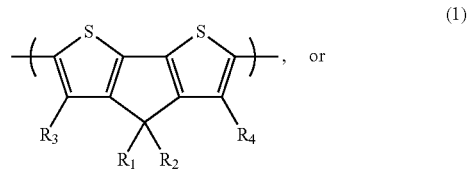

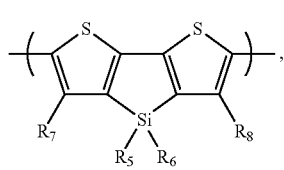
(29)

wherein each of $R_1$, $R_2$, $R_3$, $R_4$, $R_5$, $R_6$, $R_7$, and $R_8$, independently, is H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$; in which R is H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. For example, each of $R_1$, $R_2$, $R_5$, and $R_6$, independently, can be hexyl, 2-ethylhexyl, or 3,7-dimethyloctyl.

In some embodiments, the second comonomer repeat unit includes a benzothiadiazole moiety, a thiadiazoloquinoxaline moiety, a cyclopentadithiophene oxide moiety, a benzoisothiazole moiety, a benzothiazole moiety, a thiophene oxide moiety, a thienothiophene moiety, a thienothiophene oxide moiety, a dithienothiophene moiety, a dithienothiophene oxide moiety, a tetrahydroisoindole moiety, a fluorene moiety, a silole moiety, a cyclopentadithiophene moiety, a fluorenone moiety, a thiazole moiety, a selenophene moiety, a thiazolothiazole moiety, a cyclopentadithiazole moiety, a naphthothiadiazole moiety, a thienopyrazine moiety, a silacyclopentadithiophene moiety, an oxazole moiety, an imidazole moiety, a pyrimidine moiety, a benzoxazole moiety, or a benzimidazole moiety.

In some embodiments, the second comonomer repeat unit includes a benzothiadiazole moiety of formula (2), a thiadiazoloquinoxaline moiety of formula (3), a cyclopentadithiophene dioxide moiety of formula (4), a cyclopentadithiophene monoxide moiety of formula (5), a benzoisothiazole moiety of formula (6), a benzothiazole moiety of formula (7), a thiophene dioxide moiety of formula (8), a cyclopentadithiophene dioxide moiety of formula (9), a cyclopentadithiophene tetraoxide moiety of formula (10), a thienothiophene moiety of formula (11), a thienothiophene tetraoxide moiety of formula (12), a dithienothiophene moiety of formula (13), a dithienothiophene dioxide moiety of formula (14), a dithienothiophene tetraoxide moiety of formula (15), a tetrahydroisoindole moiety of formula (16), a thienothiophene dioxide moiety of formula (17), a dithienothiophene dioxide moiety of formula (18), a fluorene moiety of formula (19), a silole moiety of formula (20), a cyclopentadithiophene moiety of formula (21), a fluorenone moiety of formula (22), a thiazole moiety of formula (23), a selenophene moiety of formula (24), a thiazolothiazole moiety of formula (25), a cyclopentadithiazole moiety of formula (26), a naphthothiadiazole moiety of formula (27), a thienopyrazine moiety of formula (28), a silacyclopentadithiophene moiety of formula (29), an oxazole moiety of formula (30), an imidazole moiety of formula (31), a pyrimidine moiety of formula (32), a benzoxazole moiety of formula (33), or a benzimidazole moiety of formula (34):

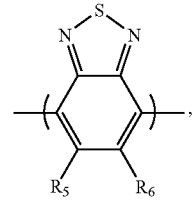
(2)

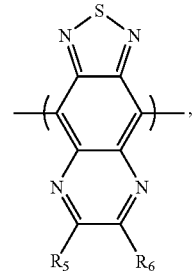
(3)

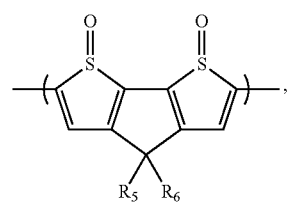
(4)

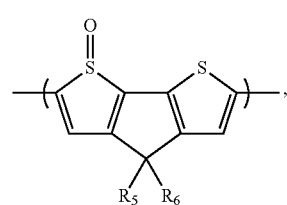
(5)

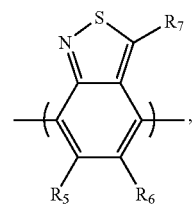
(6)

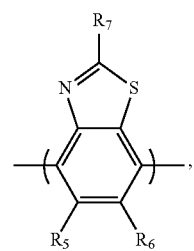
(7)

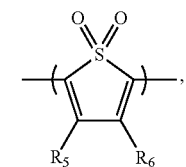
(8)

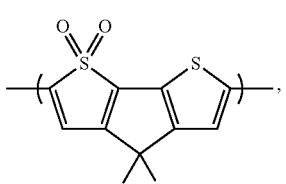 (9)
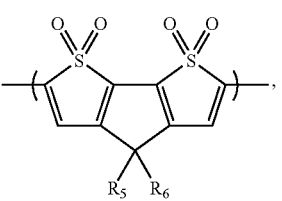 (10)
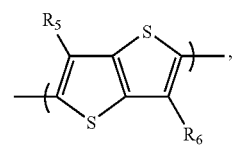 (11)
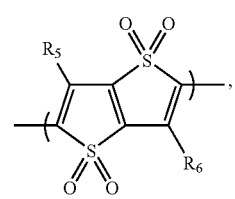 (12)
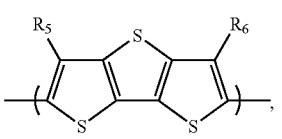 (13)
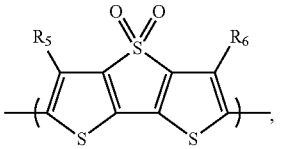 (14)
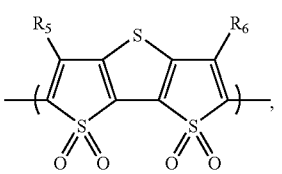 (15)
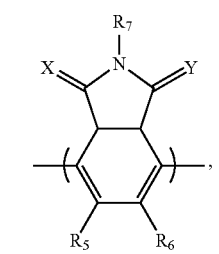 (16)
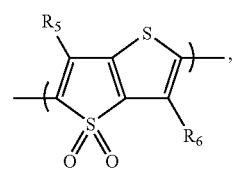 (17)
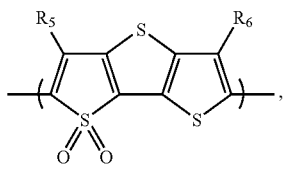 (18)
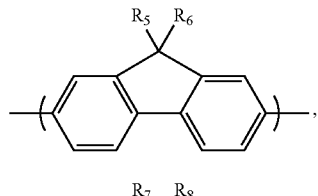 (19)
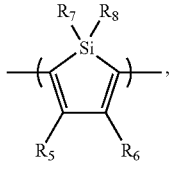 (20)
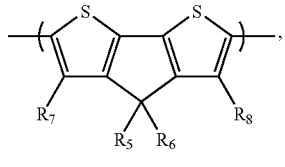 (21)
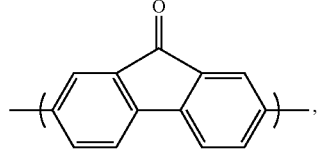 (22)
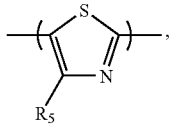 (23)
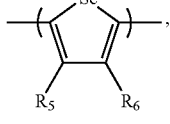 (24)
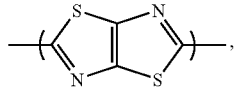 (25)
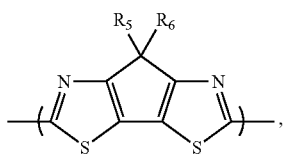 (26)

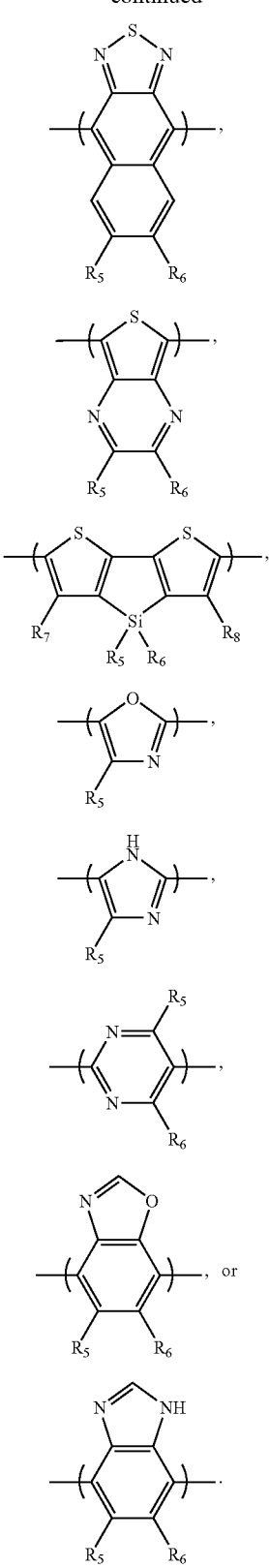

In the above formulas, each of X and Y, independently, can be $CH_2$, O, or S; each of $R_5$ and $R_6$, independently, can be H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O) OR, or $SO_2R$, in which R can be H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl; and each of $R_7$ and $R_8$, independently, can be H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl. For example, the second comonomer repeat unit includes a benzothiadiazole moiety of formula (2), in which each of $R_5$ and $R_6$ is H.

In some embodiments, the second comonomer repeat unit includes at least three thiophene moieties (e.g., five thiophene moieties). In certain embodiments, at least one of the thiophene moieties is substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl.

In some embodiments, the polymer further includes a third comonomer repeat unit. The third comonomer repeat unit can includes a thiophene moiety or a fluorene moiety, which can be substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl.

In some embodiments, the system can further include a recombination layer, which can include a p-type semiconductor material and an n-type semiconductor material. In some embodiments, the p-type and n-type semiconductor materials are blended into one layer. In certain embodiments, the recombination layer includes two layers, one layer including the p-type semiconductor material and the other layer including the n-type semiconductor material.

In some embodiments, the first photoactive layer is disposed via the first liquid-based coating process and the second photoactive layer is disposed via a second liquid-based coating process. The first or second liquid-based coating process can include solution coating, ink jet printing, spin coating, dip coating, knife coating, bar coating, spray coating, roller coating, slot coating, gravure coating, flexographic printing, or screen printing.

In some embodiments, the organic electron donor material includes a polymer. The polymer can be selected from the group consisting of polythiophenes, polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly(dithienothiophene oxide)s, polytetrahydroisoindoles, and copolymers thereof. For example, the organic electron donor material can include a polymer selected from the group consisting of polythiophenes (e.g., poly(3-hexylthiophene) (P3HT)), polycyclopentadithiophenes (e.g., poly(cyclopentadithiophene-co-benzothiadiazole)), and copolymers thereof.

In some embodiments, the organic electron acceptor material includes a material selected from the group consisting of fullerenes, oxadiazoles, carbon nanorods, polymers containing CN groups, polymers containing $CF_3$ groups, and combinations thereof. For example, the organic electron acceptor material can include a substituted fullerene (e.g., C61-phenyl-butyric acid methyl ester (PCBM)).

In some embodiments, the inorganic semiconductor material includes amorphous silicon, cadmium selenide, cadmium telluride, gallium arsenide, copper indium selenide (CIS), or copper indium gallium selenide (CIGS). In certain embodiments, the inorganic semiconductor material includes inorganic nanoparticles.

In some embodiments, the method further includes disposing a recombination layer between the first and second photoactive layers. The recombination layer can be disposed via a third liquid-based coating process, which can include solution coating, ink jet printing, spin coating, dip coating, knife coating, bar coating, spray coating, roller coating, slot coating, gravure coating, flexographic printing, or screen printing.

In some embodiments, the system further includes disposing a hole carrier layer such that the first photoactive layer is between the hole carrier layer and the second photoactive layer. The hole carrier layer can be disposed via a fourth liquid-based coating process, which can include solution coating, ink jet printing, spin coating, dip coating, knife coating, bar coating, spray coating, roller coating, slot coating, gravure coating, flexographic printing, or screen printing.

In some embodiments, the system further includes disposing a hole blocking layer such that the second photoactive layer is between the hole blocking layer and the first photoactive layer. The hole blocking layer can be disposed via a fifth liquid-based coating process, which can include solution coating, ink jet printing, spin coating, dip coating, knife coating, bar coating, spray coating, roller coating, slot coating, gravure coating, flexographic printing, or screen printing.

In some embodiments, the method includes a roll-to-roll process.

Embodiments can provide one or more of the following advantages.

In some embodiments, each layer in the photovoltaic system mentioned above can be prepared by using a liquid-based coating process that can be readily used in a continuous roll-to-roll process. Such a process can significantly reduce the cost of preparing a photovoltaic system.

In some embodiments, the photovoltaic system mentioned above can include alternating inorganic and organic layers. In such embodiments, a bottom layer (either an inorganic layer or an organic layer) would not be damaged by a solvent used to coat a neighboring top layer since the materials in an inorganic layer typically would not be dissolved in a solvent used to coat an organic layer and vice versa.

In some embodiments, the photoactive layer can include a low band gap electron donor or acceptor material, such as a polymer having an absorption wavelength at the red and near IR regions (e.g., 650-800 nm) of the electromagnetic spectrum, which is not accessible by most other conventional polymers. When such a polymer is incorporated into a photovoltaic cell (e.g., a tandem photovoltaic cell) together with a conventional semiconductive polymer (e.g., P3HT), it enables the cell to absorb the light in this region of the spectrum, thereby increasing the current and efficiency of the cell.

In some embodiments, the first and second photoactive layers have different band gaps. Thus, light not absorbed by one photoactive layer can be absorbed by another photoactive layer, thereby increasing the efficiency of the photovoltaic cell.

In some embodiments, an inorganic photoactive layer can be used as a window layer to remove UV light or the deep blue portion of the solar spectrum, which can damage the photovoltaic system.

The details of one or more embodiments of the invention are set forth in the accompanying drawings and the description below. Other features, objects, and advantages of the invention will be apparent from the description, drawings, and the claims.

DESCRIPTION OF DRAWINGS

FIG. 2 is an elevational view of an embodiment of a mesh electrode.

FIG. 3 is a cross-sectional view of the mesh electrode of FIG. 2.

Like reference symbols in the various drawings indicate like elements.

DETAILED DESCRIPTION

Figure 1:
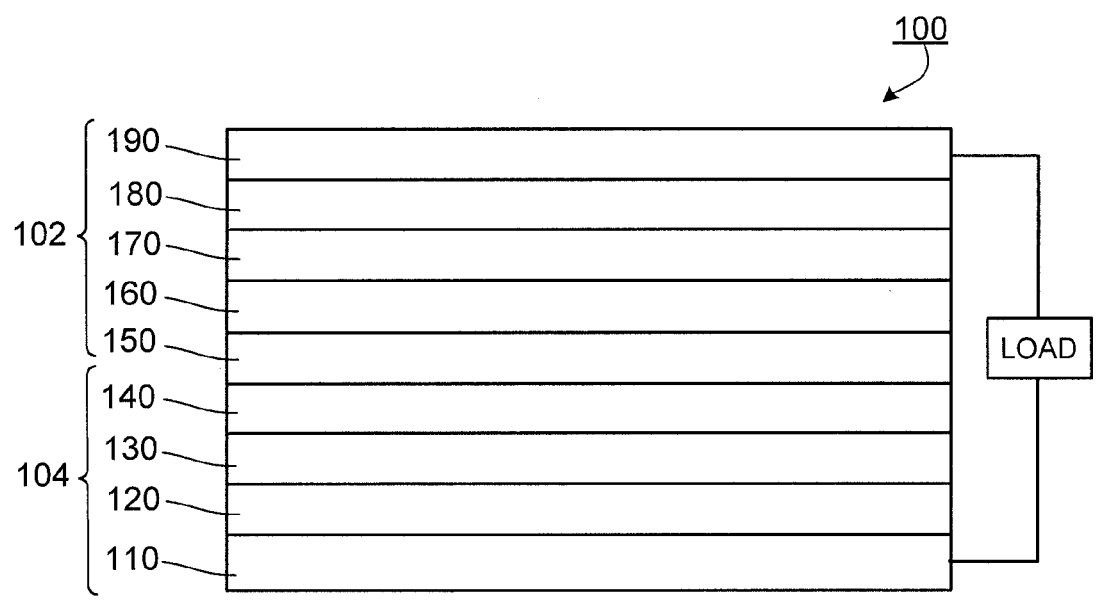
FIG. 1 is a cross-sectional view of an embodiment of a tandem photovoltaic cell.

FIG. 1 shows a tandem photovoltaic cell 100 having two semi-cells 102 and 104. Semi-cell 102 includes a cathode 110, a hole carrier layer 120, a photoactive layer 130, an n-type semiconductor layer 140, and an intermediate layer 150. Semi-cell 104 includes intermediate layer 150, a p-type semiconductor layer 160, a photoactive layer 170, a hole blocking layer 180, and an anode 190. An external load is connected to photovoltaic cell 100 via cathode 110 and anode 190. N-type semiconductor layer 140, intermediate layer 150, and p-type semiconductor layer 160 serve as a recombination layer. In general, a recombination layer refers to a layer in a tandem photovoltaic cell where the electrons generated from a first semi-cell recombine with the holes generated from a second semi-cell. N-type semiconductor layer 140 includes an n-type semiconductor material and p-type semiconductor layer 160 includes a p-type semiconductor material. In general, n-type semiconductor materials selectively transport electrons and p-type semiconductor materials selectively transport holes. As a result, electrons generated from the first semi-cell recombine with holes generated from the second semi-cell at the interface of the n-type and p-type semiconductor materials (e.g., at intermediate layer 150).

Depending on the production process and the desired device architecture, the current flow in a semi-cell can be reversed by changing the electron/hole conductivity of a certain layer (e.g., changing hole blocking layer 180 to a hole carrier layer and changing p-type semiconductor layer 160 to an n-type semiconductor layer). By doing so, a tandem photovoltaic cell can be designed such that the semi-cells in the tandem cells can be electrically interconnected either in series or in parallel.

In some embodiments, the p-type semiconductor material used in layer 160 includes a polymer and/or a metal oxide. Examples p-type semiconductor polymers include polythiophenes (e.g., poly(3,4-ethylene dioxythiophene) (PEDOT)), polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly(dithienothiophene oxide)s, polytetrahydroisoindoles, and copolymers thereof. The metal oxide can be an intrinsic p-type semiconductor (e.g., copper oxides, strontium copper oxides, or strontium titanium oxides) or a metal oxide that forms a p-type semiconductor after doping with a dopant (e.g., p-doped zinc oxides or p-doped titanium oxides). Examples of dopants includes salts or acids of fluoride, chloride, bromide, and iodide. In some embodiments, the metal oxide can be used in the form of nanoparticles.

Intermediate layer 150 generally includes a material that facilitates recombination of electrons and holes. In certain embodiments, layer 150 includes a material such that substantially all of the electrons and holes generated at photoactive layers 130 and 170 are recombined at layer 150. In some embodiments, layer 150 includes a semiconductive material or an electrically conductive material. For example, layer 150 can include semiconductive metal oxides, such as titanium oxides, indium tin oxides, tin oxides, zinc oxides, and combinations thereof. In certain embodiments, layer 150 can include non-stoichiometric metal oxides. In some embodiments, the metal oxide in layer 150 can include a dopant, such as metals (e.g., aluminum or niobium), or salts or acids of fluoride, chloride, bromide, and iodide. Layer 150 can also include electrically conductive metallic particles, such as iron, gold, silver, copper, aluminum, nickel, palladium, platinum, titanium, and their alloys.

In some embodiments, the material in intermediate layer 150 is in the form of nanoparticles. In certain embodiments, the nanoparticles have an average particle diameter of at least about 0.1 nm (e.g., at least about 0.5 nm, at least about 1 nm, at least about 5 nm, or at least about 10 nm) and/or at most about 100 nm (e.g., at most about 50 nm, at most about 10 nm, at most about 5 nm, or at most about 1 nm). In certain embodiments, the material in intermediate layer 150 is in the form of nanotubes.

Without wishing to be bound by theory, it is believed that intermediate layer 150 facilitate light absorption and plasmonic excitation. Without wishing to be bound by theory, it is also believed that intermediate layer 150 enhances recombination of electrons and holes at the recombination layer that includes layers 140, 150, and 160.

In some embodiments, the n-type semiconductor material used in layer 140 includes a metal oxide, such as titanium oxides, zinc oxides, tungsten oxides, molybdenum oxides, and combinations thereof. The metal oxide can be used in the form of nanoparticles. In other embodiments, the n-type semiconductor material includes a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof.

Each of layers 140, 150, and 160 generally has a sufficient thickness so that the layers underneath are protected from any solvent applied onto it. In some embodiments, each of layers 140, 150, and 160 can have a thickness at least about 10 nm (e.g., at least about 20 nm, at least about 50 nm, or at least about 100 nm) and/or at most about 500 nm (e.g., at most about 200 nm, at most about 150 nm, or at most about 100 nm).

In general, each of layers 140, 150, and 160 is substantially transparent. For example, at the thickness used in tandem photovoltaic cell 100, each of layers 140, 150, and 160 can transmit at least about 70% (e.g., at least about 75%, at least about 80%, at least about 85%, or at least about 90%) of incident light at a wavelength or a range of wavelengths (e.g., from about 350 nm to about 1,000 nm) used during operation of the tandem photovoltaic cell.

Each of layers 140, 150, and 160 generally has a sufficiently low resistivity. In some embodiments, each of layers 140, 150, and 160 has a resistivity of at most about $1\times10^6$ ohm/square, (e.g., at most about $5\times10^5$ ohm/square, at most about $2\times10^5$ ohm/square, or at most about $1\times10^5$ ohm/square).

Without wishing to be bound by theory, it is believed that layers 140 and 160 can be considered as electrodes of semi-cell 102 and semi-cell 104, respectively, and that layer 150 can be considered as a common electrode between these two semi-cells.

Turning to other components in photovoltaic cell 100, cathode 110 is generally formed of an electrically conductive material. Examples of electrically conductive materials include electrically conductive metals, electrically conductive alloys, and electrically conductive polymers. Exemplary electrically conductive metals include iron, gold, silver, copper, aluminum, nickel, palladium, platinum and titanium. Exemplary electrically conductive alloys include stainless steel (e.g., 332 stainless steel, 316 stainless steel), alloys of gold, alloys of silver, alloys of copper, alloys of aluminum, alloys of nickel, alloys of palladium, alloys of platinum and alloys of titanium. Exemplary electrically conducting polymers include polythiophenes (e.g., PEDOT), polyanilines (e.g., doped polyanilines), polypyrroles (e.g., doped polypyrroles). In some embodiments, combinations of electrically conductive materials are used.

In some embodiments, cathode 110 can include a mesh electrode. Examples of mesh electrodes are described in commonly-owned co-pending U.S. Patent Application Publication Nos. 20040187911 and 20060090791, the contents of which are hereby incorporated by reference.

FIGS. 2 and 3 shows a mesh cathode 110 that includes solid regions 112 and open regions 114. In general, regions 112 are formed of electrically conducting material so that mesh cathode 110 can allow light to pass therethrough via regions 114 and conduct electrons via regions 112.

The area of mesh cathode 110 occupied by open regions 114 (the open area of mesh cathode 110) can be selected as desired. Generally, the open area of mesh cathode 110 is at least about 10% (e.g., at least about 20%, at least about 30%, at least about 40%, at least about 50%, at least about 60%, at least about 70%, at least about 80%) and/or at most about 99% (e.g., at most about 95%, at most about 90%, at most about 85%) of the total area of mesh cathode 110.

Mesh cathode 110 can be prepared in various ways. In some embodiments, mesh cathode 110 is a woven mesh formed by weaving wires of material that form solid regions 112. The wires can be woven using, for example, a plain weave, a Dutch, weave, a twill weave, a Dutch twill weave, or combinations thereof. In certain embodiments, mesh cathode 110 is formed of a welded wire mesh. In some embodiments, mesh cathode 110 is formed of an expanded mesh. An expanded metal mesh can be prepared, for example, by removing regions 114 (e.g., via laser removal, via chemical etching, via puncturing) from a sheet of material (e.g., an electrically conductive material, such as a metal), followed by stretching the sheet (e.g., stretching the sheet in two dimensions). In certain embodiments, mesh cathode 110 is a metal sheet formed by removing regions 114 (e.g., via laser removal, via chemical etching, via puncturing) without subsequently stretching the sheet.

In certain embodiments, solid regions 112 are formed entirely of an electrically conductive material (e.g., regions 112 are formed of a substantially homogeneous material that is electrically conductive), such as those described above. In some embodiments, solid regions 112 can have a resistivity less than about 3 ohm per square.

In some embodiments, solid regions 112 are formed of a first material that is coated with a second material different from the first material (e.g., using metallization, using vapor deposition). In general, the first material can be formed of any desired material (e.g., an electrically insulative material, an electrically conductive material, or a semiconductive material), and the second material is an electrically conductive material. Examples of electrically insulative material from which the first material can be formed include textiles, optical fiber materials, polymeric materials (e.g., a nylon) and natural materials (e.g., flax, cotton, wool, silk). Examples of electrically conductive materials from which the first material can be formed include the electrically conductive materials disclosed above. Examples of semiconductive materials from which the first material can be formed include indium tin oxide, fluorinated tin oxide, tin oxide and zinc oxide. In some embodiments, the first material is in the form of a fiber, and the second material is an electrically conductive material that is coated on the first material. In certain embodiments, the first material is in the form of a mesh (see discussion above) that, after being formed into a mesh, is coated with the second material. As an example, the first material can be an expanded metal mesh, and the second material can be PEDOT that is coated on the expanded metal mesh.

Generally, the maximum thickness of mesh cathode 110 should be less than the total thickness of hole carrier layer 120. Typically, the maximum thickness of mesh cathode 110 is at least 0.1 micron (e.g., at least about 0.2 micron, at least about 0.3 micron, at least about 0.4 micron, at least about 0.5 micron, at least about 0.6 micron, at least about 0.7 micron, at least about 0.8 micron, at least about 0.9 micron, at least about one micron) and/or at most about 10 microns (e.g., at most about nine microns, at most about eight microns, at most about seven microns, at most about six microns, at most about five microns, at most about four microns, at most about three microns, at most about two microns).

While shown in FIG. 2 as having a rectangular shape, open regions 114 can generally have any desired shape (e.g., square, circle, semicircle, triangle, diamond, ellipse, trapezoid, irregular shape). In some embodiments, different open regions 114 in mesh cathode 110 can have different shapes.

Although shown in FIG. 3 as having square cross-sectional shape, solid regions 112 can generally have any desired shape (e.g., rectangle, circle, semicircle, triangle, diamond, ellipse, trapezoid, irregular shape). In some embodiments, different solid regions 112 in mesh cathode 110 can have different shapes. In embodiments where solid regions 112 have a circular cross-section, the cross-section can have a diameter in the range of about 5 microns to about 200 microns. In embodiments where solid regions 112 have a trapezoid cross-section, the cross-section can have a height in the range of about 0.1 micron to about 5 microns and a width in the range of about 5 microns to about 200 microns.

In some embodiments, mesh cathode 110 is flexible (e.g., sufficiently flexible to be incorporated in photovoltaic cell 100 using a continuous, roll-to-roll manufacturing process). In certain embodiments, mesh cathode 110 is semi-rigid or inflexible. In some embodiments, different regions of mesh cathode 110 can be flexible, semi-rigid or inflexible (e.g., one or more regions flexible and one or more different regions semi-rigid, one or more regions flexible and one or more different regions inflexible).

In general, mesh electrode 110 can be disposed on a substrate (not shown in FIG. 1). In some embodiments, mesh electrode 110 can be partially embedded in the substrate.

The substrate is generally formed of a transparent material. Exemplary materials from which the substrate can be formed include polyethylene terephthalates, polyimides, polyethylene naphthalates, polymeric hydrocarbons, cellulosic polymers, polycarbonates, polyamides, polyethers and polyether ketones. In certain embodiments, the polymer can be a fluorinated polymer. In some embodiments, combinations of polymeric materials are used. In certain embodiments, different regions of the substrate can be formed of different materials.

In general, the substrate can be flexible, semi-rigid or rigid (e.g., glass). In some embodiments, the substrate has a flexural modulus of less than about 5,000 megaPascals (e.g., less than 1,000 megaPascals or less than 500 megaPascals). In certain embodiments, different regions of the substrate can be flexible, semi-rigid or inflexible (e.g., one or more regions flexible and one or more different regions semi-rigid, one or more regions flexible and one or more different regions inflexible).

Typically, the substrate is at least about one micron (e.g., at least about five microns, at least about 10 microns) thick and/or at most about 1,000 microns (e.g., at most about 500 microns thick, at most about 300 microns thick, at most about 200 microns thick, at most about 100 microns, at most about 50 microns) thick.

Generally, the substrate can be colored or non-colored. In some embodiments, one or more portions of the substrate is/are colored while one or more different portions of the substrate is/are non-colored.

The substrate can have one planar surface (e.g., the surface on which light impinges), two planar surfaces (e.g., the surface on which light impinges and the opposite surface), or no planar surfaces. A non-planar surface of the substrate can, for example, be curved or stepped. In some embodiments, a non-planar surface of the substrate is patterned (e.g., having patterned steps to form a Fresnel lens, a lenticular lens or a lenticular prism).

Hole carrier layer 120 is generally formed of a material that, at the thickness used in tandem photovoltaic cell 100, transports holes to cathode 110 and substantially blocks the transport of electrons to cathode 110. Examples of materials from which layer 120 can be formed include polythiophenes (e.g., PEDOT), polyanilines, polyvinylcarbazoles, polyphenylenes, polyphenylvinylenes, polysilanes, polythienylenevinylenes, polyisothianaphthanenes, and copolymers thereof. In some embodiments, hole carrier layer 120 can include combinations of hole carrier materials.

In general, the thickness of hole carrier layer 120 (i.e., the distance between the surface of hole carrier layer 120 in contact with photoactive layer 130 and the surface of cathode 110 in contact with hole carrier layer 120) can be varied as desired. Typically, the thickness of hole carrier layer 120 is at least 0.01 micron (e.g., at least about 0.05 micron, at least about 0.1 micron, at least about 0.2 micron, at least about 0.3 micron, or at least about 0.5 micron) and/or at most about five microns (e.g., at most about three microns, at most about two microns, or at most about one micron). In some embodiments, the thickness of hole carrier layer 120 is from about 0.01 micron to about 0.5 micron.

At least one of photoactive layers 130 and 170 (e.g., both layers 130 and 170) can contain an electron acceptor material (e.g., an organic electron acceptor material) and an electron donor material (e.g., an organic electron donor material). In some embodiments, at least one of photoactive layers 130 and 170 (e.g., both layers 130 and 170) can contain an inorganic semiconductor material. In certain embodiments, one of photoactive layers 130 and 170 contains organic electron acceptor and donor materials and the other of photoactive layers 130 and 170 contains an inorganic semiconductor material.

Examples of electron acceptor materials include fullerenes, oxadiazoles, carbon nanorods, discotic liquid crystals, inorganic nanoparticles (e.g., nanoparticles formed of zinc oxide, tungsten oxide, indium phosphide, cadmium selenide and/or lead sulphide), inorganic nanorods (e.g., nanorods formed of zinc oxide, tungsten oxide, indium phosphide, cadmium selenide and/or lead sulphide), or polymers containing moieties capable of accepting electrons or forming stable anions (e.g., polymers containing CN groups, polymers containing $CF_3$ groups). In some embodiments, the electron acceptor material is a substituted fullerene (e.g., PCBM). In some embodiments, a combination of electron acceptor materials can be used in photoactive layer 130 or 170.

Examples of electron donor materials include conjugated polymers, such as polythiophenes, polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxalines, polybenzoisothiazoles, polybenzothiazoles, polythienothiophenes, poly(thienothiophene oxide)s, polydithienothiophenes, poly(dithienothiophene oxide)s, polytetrahydroisoindoles, and copolymers thereof. In some embodiments, the electron donor material can be polythiophenes (e.g., poly(3-hexylthiophene) (P3HT)), polycyclopentadithiophenes, and copolymers thereof. In certain embodiments, a combination of electron donor materials can be used in photoactive layer 130 or 170.

In some embodiments, the electron donor materials or the electron acceptor materials can include a polymer having a first comonomer repeat unit and a second comonomer repeat unit different from the first comonomer repeat unit. The first comonomer repeat unit can include a cyclopentadithiophene moiety, a silacyclopentadithiophene moiety, a cyclopentadithiazole moiety, a thiazolothiazole moiety, a thiazole moiety, a benzothiadiazole moiety, a thiophene oxide moiety, a cyclopentadithiophene oxide moiety, a polythiadiazoloquinoxaline moiety, a benzoisothiazole moiety, a benzothiazole moiety, a thienothiophene moiety, a thienothiophene oxide moiety, a dithienothiophene moiety, a dithienothiophene oxide moiety, or a tetrahydroisoindoles moiety.

In some embodiments, the first comonomer repeat unit includes a cyclopentadithiophene or silacyclopentadithiophene moiety. In some embodiments, the cyclopentadithiophene or silacyclopentadithiophene moiety is substituted with at least one substituent selected from the group consisting of $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, and $SO_2R$; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. For example, the cyclopentadithiophene or silacyclopentadithiophene moiety can be substituted with hexyl, 2-ethylhexyl, or 3,7-dimethyloctyl. In certain embodiments, the cyclopentadithiophene or silacyclopentadithiophene moiety is substituted at 4-position.

In some embodiments, the first comonomer repeat unit includes a cyclopentadithiophene moiety of formula (1) or a silacyclopentadithiophene moiety of formula (29):

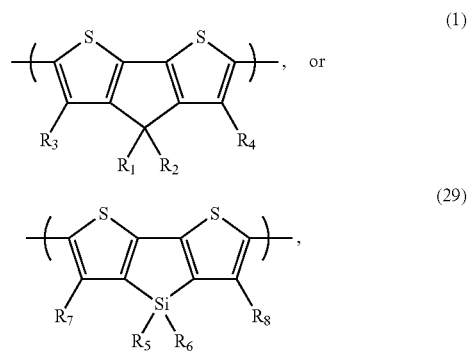

wherein each of $R_1$, $R_2$, $R_3$, $R_4$, $R_5$, $R_6$, $R_7$, and $R_8$ independently, is H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$; in which R is H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. For example, each of $R_1$, $R_2$, $R_5$, and $R_6$, independently, can be hexyl, 2-ethylhexyl, or 3,7-dimethyloctyl.

An alkyl can be saturated or unsaturated and branch or straight chained. A $C_1$-$C_{20}$ alkyl contains 1 to 20 carbon atoms (e.g., one, two, three, four, five, six, seven, eight, nine, 10, 11, 12, 13, 14, 15, 16, 17, 18, 19, and 20 carbon atoms). Examples of alkyl moieties include —$CH_3$, —$CH_2$—, —$CH_2$=$CH_2$—, —$CH_2$—CH=$CH_2$, and branched —$C_3H_7$. An alkoxy can be branch or straight chained and saturated or unsaturated. An $C_1$-$C_{20}$ alkoxy contains an oxygen radical and 1 to 20 carbon atoms (e.g., one, two, three, four, five, six, seven, eight, nine, 10, 11, 12, 13, 14, 15, 16, 17, 18, 19, and 20 carbon atoms). Examples of alkoxy moieties include —$OCH_3$ and —OCH=CH—$CH_3$. A cycloalkyl can be either saturated or unsaturated. A $C_3$-$C_{20}$ cycloalkyl contains 3 to 20 carbon atoms (e.g., three, four, five, six, seven, eight, nine, 10, 11, 12, 13, 14, 15, 16, 17, 18, 19, and 20 carbon atoms). Examples of cycloalkyl moieities include cyclohexyl and cyclohexen-3-yl. A heterocycloalkyl can also be either saturated or unsaturated. A $C_3$-$C_{20}$ heterocycloalkyl contains at least one ring heteroatom (e.g., O, N, and S) and 3 to 20 carbon atoms (e.g., three, four, five, six, seven, eight, nine, 10, 11, 12, 13, 14, 15, 16, 17, 18, 19, and 20 carbon atoms). Examples of heterocycloalkyl moieties include 4-tetrahydropyranyl and 4-pyranyl. An aryl can contain one or more aromatic rings. Examples of aryl moieties include phenyl, phenylene, naphthyl, naphthylene, pyrenyl, anthryl, and phenanthryl. A heteroaryl can contain one or more aromatic rings, at least one of which contains at least one ring heteroatom (e.g., O, N, and S). Examples of heteroaryl moieties include furyl, furylene, fluorenyl, pyrrolyl, thienyl, oxazolyl, imidazolyl, thiazolyl, pyridyl, pyrimidinyl, quinazolinyl, quinolyl, isoquinolyl, and indolyl.

Alkyl, alkoxy, cycloalkyl, heterocycloalkyl, aryl, and heteroaryl mentioned herein include both substituted and unsubstituted moieties, unless specified otherwise. Examples of substituents on cycloalkyl, heterocycloalkyl, aryl, and heteroaryl include $C_1$-$C_{20}$ alkyl, $C_3$-$C_{20}$ cycloalkyl, $C_1$-$C_{20}$ alkoxy, aryl, aryloxy, heteroaryl, heteroaryloxy, amino, $C_1$-$C_{10}$ alkylamino, $C_1$-$C_{20}$ dialkylamino, arylamino, diarylamino, hydroxyl, halogen, thio, $C_1$-$C_{10}$ alkylthio, arylthio, $C_1$-$C_{10}$ alkylsulfonyl, arylsulfonyl, cyano, nitro, acyl, acyloxy, carboxyl, and carboxylic ester. Examples of substituents on alkyl or alkoxy include all of the above-recited substituents except $C_1$-$C_{20}$ alkyl. Cycloalkyl, heterocycloalkyl, aryl, and heteroaryl also include fused groups.

The second comonomer repeat unit can include a benzothiadiazole moiety, a thiadiazoloquinoxaline moiety, a cyclopentadithiophene oxide moiety, a benzoisothiazole moiety, a benzothiazole moiety, a thiophene oxide moiety, a thienothiophene moiety, a thienothiophene oxide moiety, a dithienothiophene moiety, a dithienothiophene oxide moiety, a tetrahydroisoindole moiety, a fluorene moiety, a silole moiety, a cyclopentadithiophene moiety, a fluorenone moiety, a thiazole moiety, a selenophene moiety, a thiazolothiazole moiety, a cyclopentadithiazole moiety, a naphthothiadiazole moiety, a thienopyrazine moiety, a silacyclopentadithiophene moiety, an oxazole moiety, an imidazole moiety, a pyrimidine moiety, a benzoxazole moiety, or a benzimidazole moiety. In some embodiments, the second comonomer repeat unit is a 3,4-benzo-1,2,5-thiadiazole moiety.

In some embodiments, the second comonomer repeat unit can include a benzothiadiazole moiety of formula (2), a thiadiazoloquinoxaline moiety of formula (3), a cyclopentadithiophene dioxide moiety of formula (4), a cyclopentadithiophene monoxide moiety of formula (5), a benzoisothiazole moiety of formula (6), a benzothiazole moiety of formula (7), a thiophene dioxide moiety of formula (8), a cyclopentadithiophene dioxide moiety of formula (9), a cyclopentadithiophene tetraoxide moiety of formula (10), a thienothiophene moiety of formula (11), a thienothiophene tetraoxide moiety of formula (12), a dithienothiophene moiety of formula (13), a dithienothiophene dioxide moiety of formula (14), a dithienothiophene tetraoxide moiety of formula (15), a tetrahydroisoindole moiety of formula (16), a thienothiophene dioxide moiety of formula (17), a dithienothiophene dioxide moiety of formula (18), a fluorene moiety of formula (19), a silole moiety of formula (20), a cyclopentadithiophene moiety of formula (21), a fluorenone moiety of formula (22), a thiazole moiety of formula (23), a selenophene moiety of formula (24), a thiazolothiazole moiety of formula (25), a cyclopentadithiazole moiety of formula (26), a naphthothiadiazole moiety of formula (27), a thienopyrazine moiety of formula (28), a silacyclopentadithiophene moiety of formula (29), an oxazole moiety of formula (30), an imidazole moiety of formula (31), a pyrimidine moiety of formula (32), a benzoxazole moiety of formula (33), or a benzimidazole moiety of formula (34):

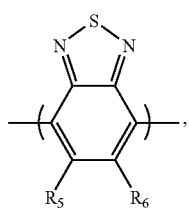

(2)

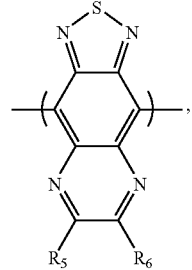

(3)

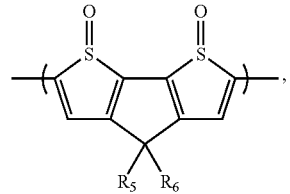

(4)

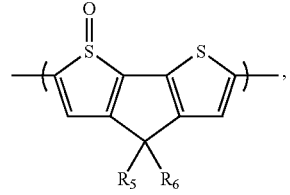

(5)

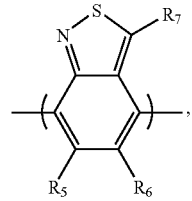

(6)

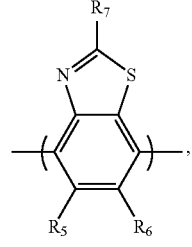

(7)

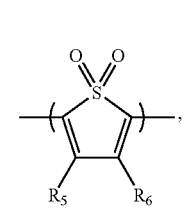

(8)

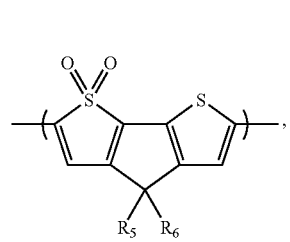

(9)

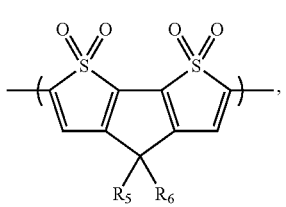 (10)
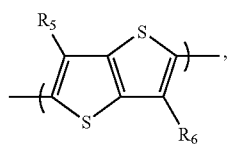 (11)
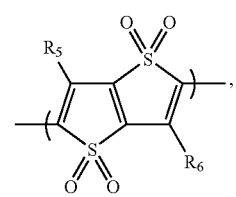 (12)
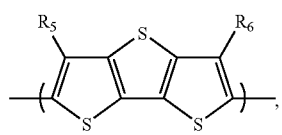 (13)
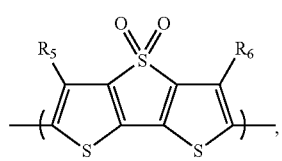 (14)
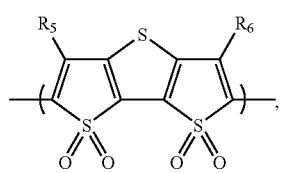 (15)
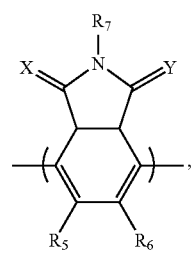 (16)
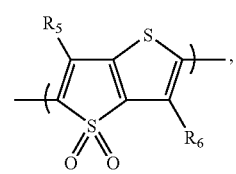 (17)
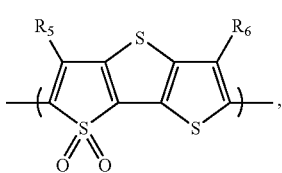 (18)
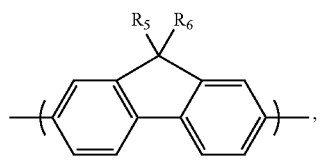 (19)
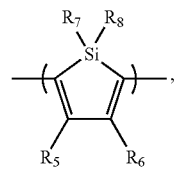 (20)
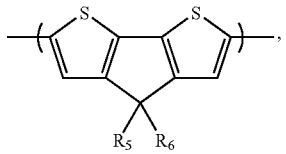 (21)
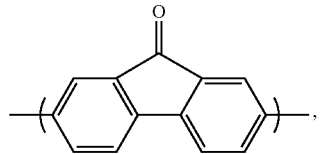 (22)
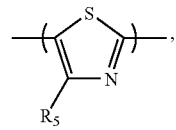 (23)
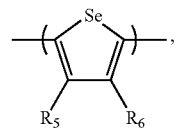 (24)
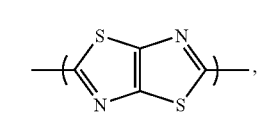 (25)
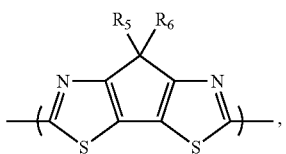 (26)
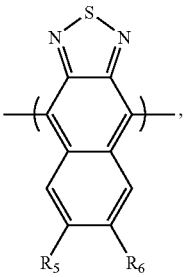 (27)

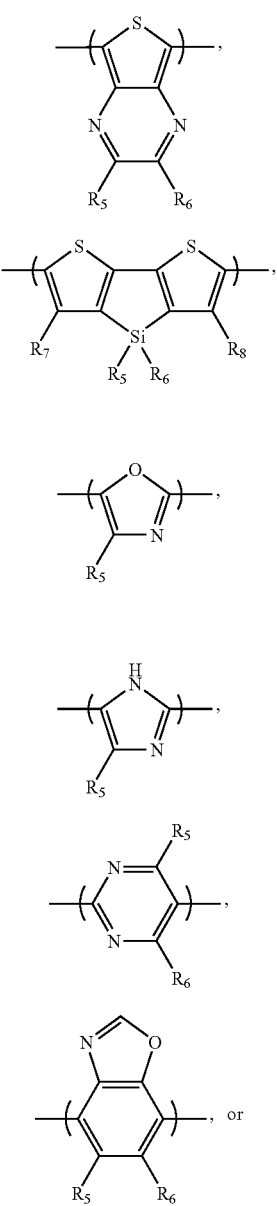

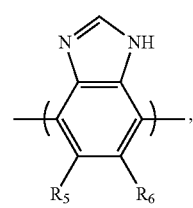

In the above formulas, each of X and Y, independently, is $CH_2$, O, or S; each of $R_5$ and $R_6$, independently, is H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$, in which R is H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl; and each of $R_7$ and $R_8$, independently, is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl. In some embodiments, the second comonomer repeat unit includes a benzothiadiazole moiety of formula (2), in which each of $R_5$ and $R_6$ is H.

The second comonomer repeat unit can include at least three thiophene moieties. In some embodiments, at least one of the thiophene moieties is substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl. In certain embodiments, the second comonomer repeat unit includes five thiophene moieties.

The polymer can further include a third comonomer repeat unit that contains a thiophene moiety or a fluorene moiety. In some embodiments, the thiophene or fluorene moiety is substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl.

In some embodiments, the polymer can be formed by any combination of the first, second, and third comonomer repeat units. In certain embodiments, the polymer can be a homopolymer containing any of the first, second, and third comonomer repeat units.

In some embodiments, the polymer can be

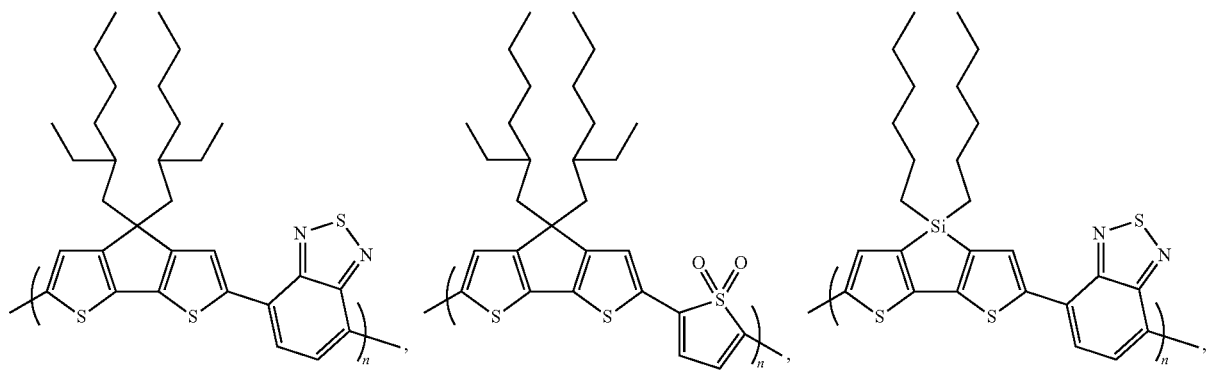

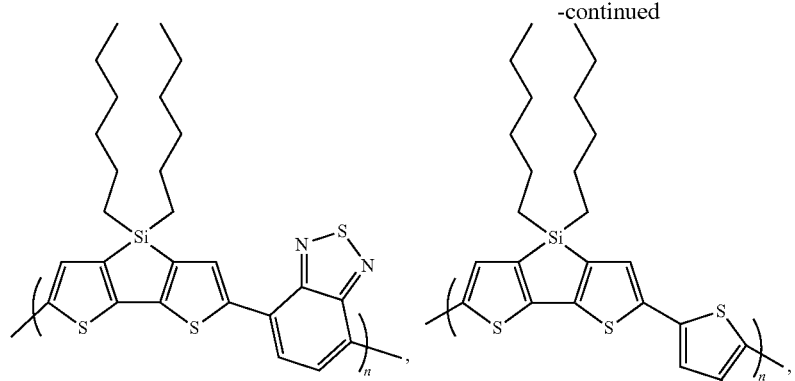
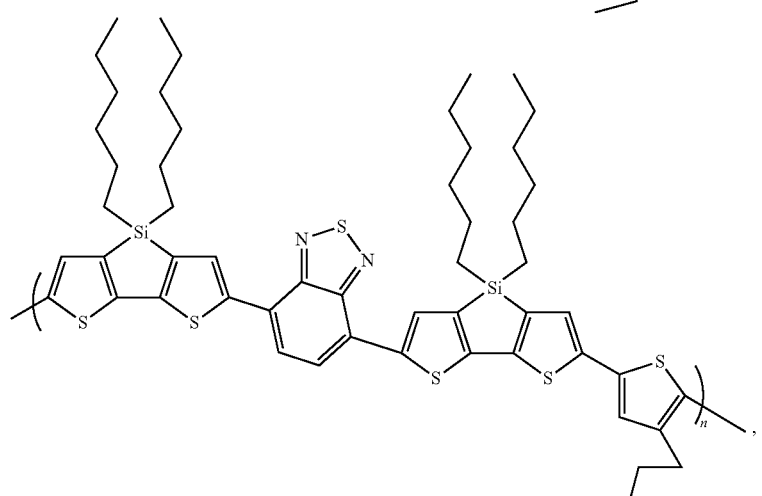
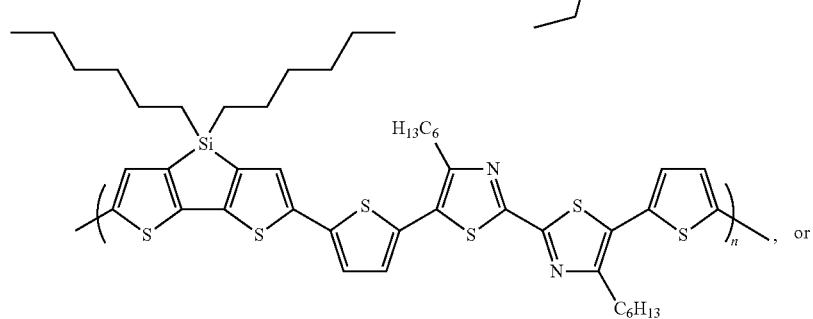
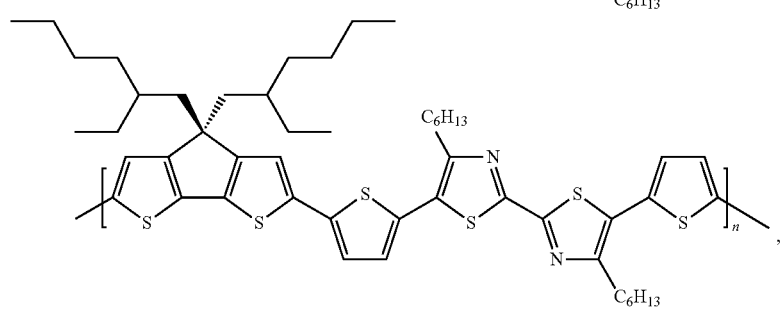
in which n can be an integer greater than 1.

The monomers for preparing the polymers mentioned herein can contain one or more non-aromatic double bonds and one or more asymmetric centers. Thus, they can occur as racemates and racemic mixtures, single enantiomers, individual diastereomers, diastereomeric mixtures, and cis- or trans-isomeric forms. All such isomeric forms are contemplated.

The polymers described above can be prepared by the methods known in the art, such as those described in commonly-owned co-pending U.S. application Ser. No. 11/601, 374, the contents of which are hereby incorporated by reference. For example, a copolymer can be prepared by a cross-coupling reaction between one or more comonomers containing two alkylstannyl groups and one or more comonomers containing two halo groups in the presence of a transition metal catalyst. As another example, a copolymer can be prepared by a cross-coupling reaction between one or more comonomers containing two borate groups and one or more comonomers containing two halo groups in the presence of a transition metal catalyst. The comonomers can be prepared by the methods described herein or by the methods know in the art, such as those described in U.S. patent application Ser. No. 11/486,536, Coppo et al., Macromolecules 2003, 36, 2705-2711, and Kurt et al., J Heterocycl. Chem. 1970, 6, 629, the contents of which are hereby incorporated by reference.

Without wishing to be bound by theory, it is believed that an advantage of the polymers described above is that their absorption wavelengths shift toward the red and near IR regions (e.g., 650-800 nm) of the electromagnetic spectrum, which is not accessible by most other conventional polymers. When such a polymer is incorporated into a photovoltaic cell (e.g., a tandem photovoltaic cell) together with a conventional semiconductive polymer (e.g., P3HT), it enables the cell to absorb the light in this region of the spectrum, thereby increasing the current and efficiency of the cell.

In some embodiments, the HOMO level of the polymers can be positioned correctly relative to the LUMO of an electron acceptor (e.g., PCBM) in a photovoltaic cell (e.g., a polymer-fullerene cell or a tandem cell), allowing for high cell voltage. The LUMO of the polymers can be positioned correctly relative to the conduction band of the electron acceptor in a photovoltaic cell, thereby creating efficient transfer of an electron to the electron acceptor. For example, using a polymer having a band gap of about 1.4-1.6 eV can significantly enhance cell voltage. Cell performance, specifically efficiency, can benefit from both an increase in photocurrent and an increase in cell voltage, and can approach and even exceed 15% efficiency. The positive charge mobility of the polymers can be relatively high and approximately in the range of $10^{-4}$ to $10^{-1}$ cm$^2$/Vs. In general, the relatively high positive charge mobility allows for relatively fast charge separation. The polymers can also be soluble in an organic solvent and/or film forming. Further, the polymers can be optically non-scattering.

In some embodiments, photoactive layer 130 has a first band gap and photoactive layer 170 has a second band gap different from the first band gap. In such embodiments, light not absorbed by one photoactive layer can be absorbed by another photoactive layer, thereby increasing the efficiency of photovoltaic cell 100.

Generally, photoactive layer 130 or 170 is sufficiently thick to be relatively efficient at absorbing photons impinging thereon to form corresponding electrons and holes, and sufficiently thin to be relatively efficient at transporting the holes and electrons. In certain embodiments, photoactive layer 130 or 170 is at least 0.05 micron (e.g., at least about 0.1 micron, at least about 0.2 micron, at least about 0.3 micron) thick and/or at most about one micron (e.g., at most about 0.5 micron, at most about 0.4 micron) thick. In some embodiments, photoactive layer 130 or 170 is from about 0.1 micron to about 0.2 micron thick.

In some embodiments, one or both of photoactive layers 130 and 170 can contain an inorganic semiconductor material. In some embodiments, the inorganic semiconductor material includes group IV semiconductor materials, group III-V semiconductor materials, group II-VI semiconductor materials, chalcogen semiconductor materials, and semiconductor metal oxides. Examples of group IV semiconductor materials include amorphous silicon, crystalline silicon (e.g., microcrystalline silicon or polycrystalline silicon), and germanium. Examples of group III-V semiconductor materials include gallium arsenide and indium phosphide. Examples of group II-VI semiconductor materials include cadmium selenide and cadmium telluride. Examples of chalcogen semiconductor materials include copper indium selenide (CIS) and copper indium gallium selenide (CIGS). Examples of semiconductor metal oxides include copper oxides, titanium oxides, zinc oxides, tungsten oxides, molybdenum oxides, strontium copper oxides, or strontium titanium oxides. In certain embodiments, the bandgap of the semiconductor can be adjusted via doping. In some embodiments, the inorganic semiconductor material can include inorganic nanoparticles.

Without wishing to be bound by theory, it is believed that tandem photovoltaic cell 100 achieves the highest efficiency when photoactive layers 130 and 170 generate substantially the same amount of current.

Hole blocking layer 180 is generally formed of a material that, at the thickness used in photovoltaic cell 100, transports electrons to anode 190 and substantially blocks the transport of holes to anode 190. Examples of materials from which hole blocking layer 180 can be formed include LiF, metal oxides (e.g., zinc oxide, titanium oxide), and combinations thereof.

Typically, hole blocking layer 180 is at least 0.02 micron (e.g., at least about 0.03 micron, at least about 0.04 micron, at least about 0.05 micron) thick and/or at most about 0.5 micron (e.g., at most about 0.4 micron, at most about 0.3 micron, at most about 0.2 micron, at most about 0.1 micron) thick.

Anode 190 is generally formed of an electrically conductive material, such as one or more of the electrically conductive materials noted above. In some embodiments, anode 190 is formed of a combination of electrically conductive materials. In certain embodiments, anode 190 can be formed of a mesh electrode.

In some embodiments, anode 190 can be encapsulated by a substrate (not shown in FIG. 1). The substrate can be formed of the same material, or have the same characteristics, as the substrate adjacent to cathode 110.

In general, each of hole carrier layer 120, photoactive layer 130, n-type semiconductor layer 140, intermediate layer 150, p-type semiconductor layer 160, photoactive layer 170, and hole blocking layer 180 can be prepared by a liquid-based coating process. The term "liquid-based coating process" mentioned herein refers to a process that uses a liquid-based coating composition. Examples of the liquid-based coating composition can be a solution, a dispersion, or a suspension. The concentration of a liquid-based coating composition can generally be adjusted as desired. In some embodiments, the concentration can be adjusted to achieve a desired viscosity of the coating composition or a desired thickness of the coating. The materials used in each of layers 120-180 generally can be dissolved or dispersed in a solvent that does not dissolve the materials used in a neighboring layer.

The liquid-based coating process can be carried out by using at least one of the following processes: solution coating, ink jet printing, spin coating, dip coating, knife coating, bar coating, spray coating, roller coating, slot coating, gravure coating, flexographic printing, or screen printing. Without wishing to bound by theory, it is believed that the liquid-based coating process can be readily used in a continuous manufacturing process, such as a roll-to-roll process, thereby significantly reducing the time and cost of preparing a photovoltaic cell. Examples of roll-to-roll processes have been described in, for example, commonly-owned co-pending U.S. Ser. No. 11/134,921, U.S. Ser. No. 10/395,823, and U.S. Ser. No. 11/127,439, the contents of which are hereby incorporated by reference.

In some embodiments, when layer 120, 130, 140, 150, 160, 170, or 180 includes inorganic semiconductor nanoparticles, the liquid-based coating process can be carried out by (1) mixing the nanoparticles (e.g., CIS or CIGS nanoparticles) with a solvent (e.g., an aqueous solvent or an anhydrous alcohol) to form a dispersion, (2) coating the dispersion onto a substrate, and (3) drying the coated dispersion. In certain embodiments, a liquid-based coating process for preparing a layer containing inorganic metal oxide nanoparticles can be carried out by (1) dispersing a precursor (e.g., a titanium salt) in a suitable solvent (e.g., an anhydrous alcohol) to form a dispersion, (2) coating the dispersion on a photoactive layer, (3) hydrolyzing the dispersion to form an inorganic semiconductor nanoparticles layer (e.g., a titanium oxide nanoparticles layer), and (4) drying the inorganic semiconductor material layer. In certain embodiments, the liquid-based coating process can be carried out by a sol-gel process.

In general, the liquid-based coating process used to prepare a layer containing an organic semiconductor material can be the same as or different from that used to prepare a layer containing an inorganic semiconductor material. In some embodiments, when layer 120, 130, 140, 150, 160, 170, or 180 includes an organic semiconductor material, the liquid-based coating process can be carried out by mixing the organic semiconductor material with a solvent (e.g., an organic solvent) to form a solution or a dispersion, coating the solution or dispersion on a substrate, and drying the coated solution or dispersion. For example, an organic photoactive layer can be prepared by mixing an electron donor material (e.g., P3HT) and an electron acceptor material (e.g., PCBM) in a suitable solvent (e.g., xylene) to form a dispersion, coating the dispersion onto a substrate, and drying the coated dispersion.

The liquid-based coating process can be carried out at an elevated temperature (e.g., at least about 50° C., at least about 100° C., at least about 200° C., or at least about 300° C.). The temperature can be adjusted depending on various factors, such as the coating process and the coating composition used. For example, when preparing a layer containing inorganic nanoparticles, the nanoparticles can be sintered at a high temperature (e.g., at least about 300° C.) to form interconnected nanoparticles. On the other hand, when a polymeric linking agent (e.g., poly(n-butyl titanate)) is added to the inorganic nanoparticles, the sintering process can be carried out at a lower temperature (e.g., less than about 300° C.).

Figure 4:
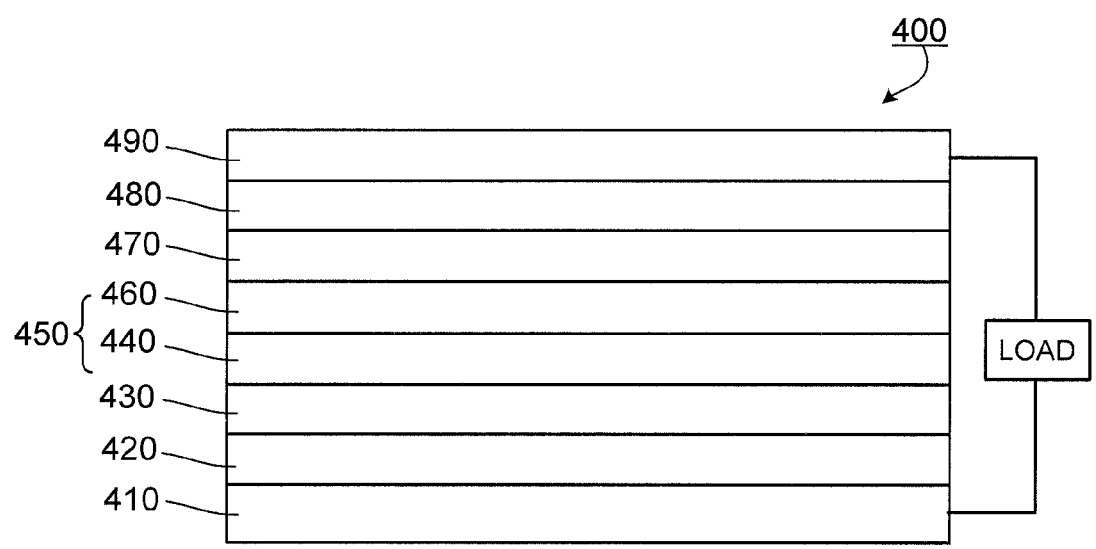
FIG. 4 is a cross-sectional view of another embodiment of a tandem photovoltaic cell.

In some embodiments, intermediate layer 150 described in FIG. 1 can be omitted from a tandem photovoltaic cell. For example, FIG. 4 shows a tandem photovoltaic cell 400 having a cathode 410, a hole carrier layer 420, a photoactive layer 430, a recombination layer 450, a photoactive layer 470, a hole blocking layer 480, an anode 490, and an external load connected to photovoltaic cell 400 via cathode 410 and anode 490. Recombination layer 450 includes a layer 440 that contains an n-type semiconductor material and a layer 460 that contains a p-type semiconductor material.

In some embodiments, the p-type and n-type semiconductor materials are blended into one layer. In such embodiments, layers 440 and 460 merge into a one-layer recombination layer 450.

In some embodiments, recombination layer 450 includes at least about 30 wt % (e.g., at least about 40 wt % or at least about 50 wt %) and/or at most about 70 wt % (e.g., at most about 60 wt % or at most about 50 wt %) of the p-type semiconductor material. In some embodiments, recombination layer 140 includes at least about 30 wt % (e.g., at least about 40 wt % or at least about 50 wt %) and/or at most about 70 wt % (e.g., at most about 60 wt % or at most about 50 wt %) of the n-type semiconductor material.

In some embodiments, a two-layer recombination layer can be prepared by applying a layer of an n-type semiconductor material and a layer of a p-type semiconductor material separately. For example, when titanium oxide nanoparticles are used as an n-type semiconductor material, a layer of titanium oxide nanoparticles can be formed by (1) dispersing a precursor (e.g., a titanium salt) in a solvent (e.g., an anhydrous alcohol) to form a dispersion, (2) coating the dispersion on a photoactive layer, (3) hydrolyzing the dispersion to form a titanium oxide layer, and (4) drying the titanium oxide layer. As another example, when a polymer (e.g., PEDOT) is used a p-type semiconductor, a polymer layer can be formed by first dissolving the polymer in a solvent (e.g., an anhydrous alcohol) to form a solution and then coating the solution on a photoactive layer. In some embodiments, a one-layer recombination layer can be prepared by applying a blend of an n-type semiconductor material and a p-type semiconductor material on photoactive layer. For example, an n-type semiconductor and a p-type semiconductor can be first dispersed and/or dissolved in a solvent together to form a dispersion or solution and then coated the dispersion or solution on a photoactive layer to form a recombination layer. The coating process mentioned above can be achieved by using at least one of the liquid-based coating processes mentioned above.

Figure 5:
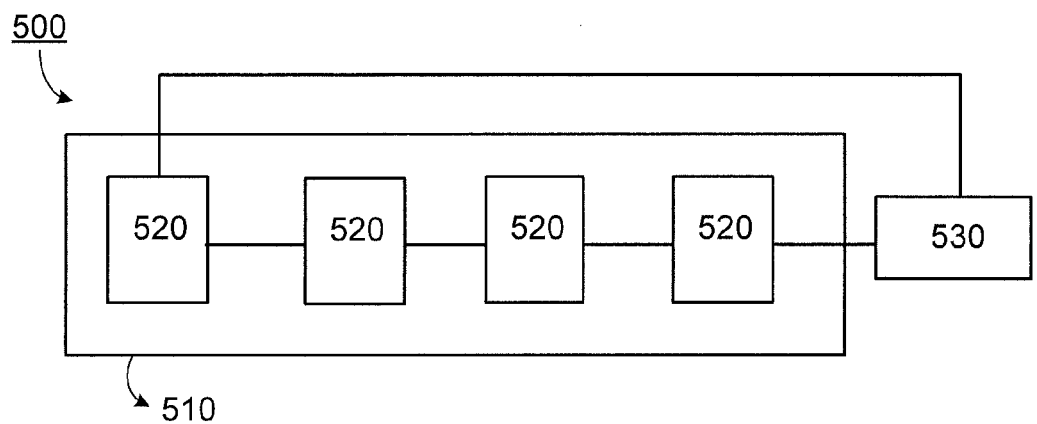
FIG. 5 is a schematic of a system containing multiple photovoltaic cells electrically connected in series.
Figure 6:
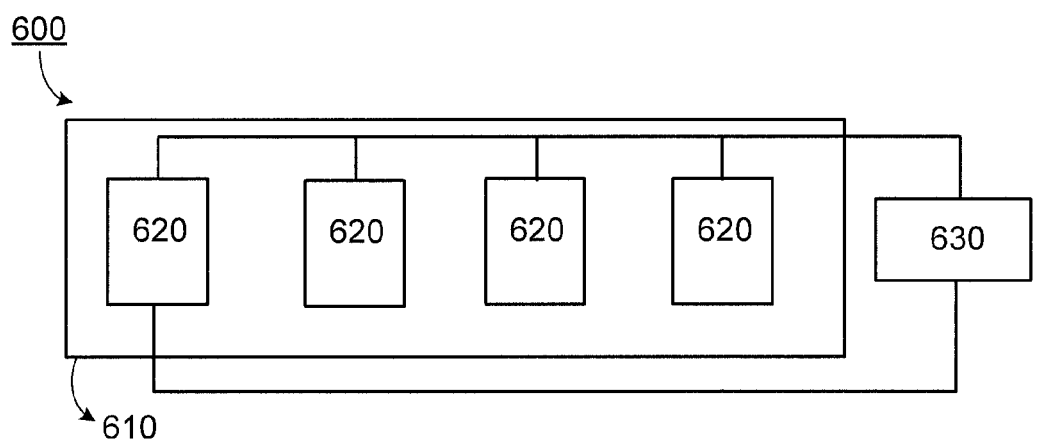
FIG. 6 is a schematic of a system containing multiple photovoltaic cells electrically connected in parallel.

In some embodiments, multiple tandem photovoltaic cells can be electrically connected to form a photovoltaic system. As an example, FIG. 5 is a schematic of a photovoltaic system 500 having a module 510 containing tandem photovoltaic cells 520. Cells 520 are electrically connected in series, and system 500 is electrically connected to a load 530. As another example, FIG. 6 is a schematic of a photovoltaic system 600 having a module 610 that contains tandem photovoltaic cells 620. Cells 620 are electrically connected in parallel, and system 600 is electrically connected to a load 630. In some embodiments, some (e.g., all) of the tandem photovoltaic cells in a photovoltaic system can have one or more common substrates. In certain embodiments, some tandem photovoltaic cells in a photovoltaic system are electrically connected in series, and some tandem photovoltaic cells in the photovoltaic system are electrically connected in parallel.

Figure 7:
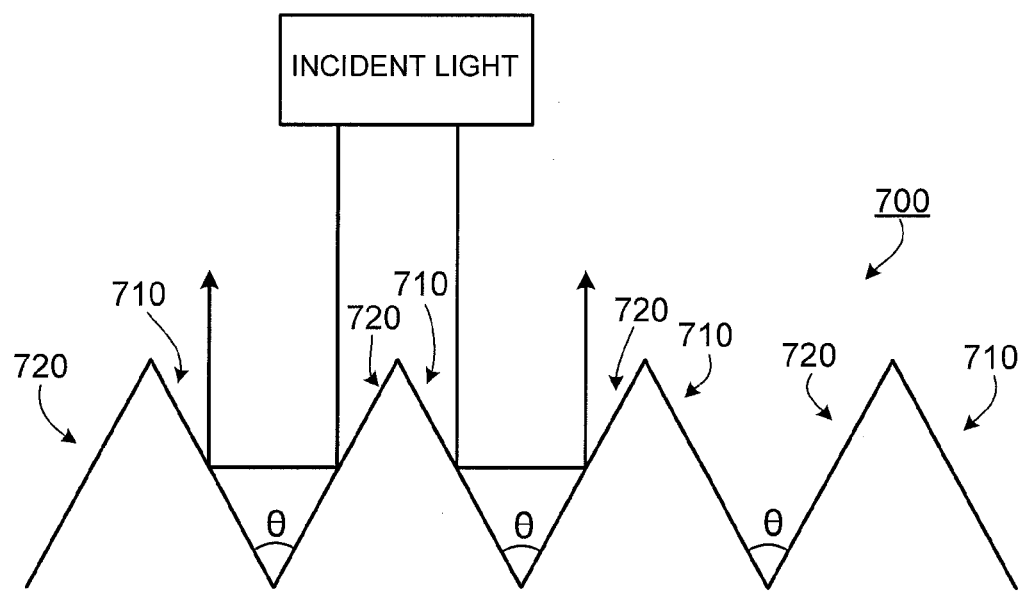
FIG. 7 is a cross-sectional view of an unfolded photovoltaic module.
Figure 8:
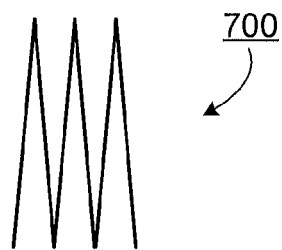
FIG. 8 is a cross-sectional view of a folded photovoltaic module.

In some embodiments, a plurality of tandem photovoltaic cells can be electrically and/or mechanically connected to form a photovoltaic module. FIG. 7 shows a cross-sectional view of an unfolded photovoltaic module 700 that includes a plurality of tandem photovoltaic cells 710 and 720. Each pair of tandem photovoltaic cells 710 and 720 form a V-shaped portion having an angle θ. The angle θ generally allows the incident light not absorbed by one tandem photovoltaic cell on one side of the V-shaped portion be reflected to the tandem photovoltaic cell on the other side of the same V-shaped portion. In some embodiments, the angle θ is at least about 5° (e.g., at least about 10°, at least about 30°, at least about 50°, at least about 70°, at least about 90°, at least about 110°, at least about 130°, at least about 150°, or at least about 170°) and/or at most about 175° (e.g., at most about 160°, at most about 140°, at most about 120°, at most about 100°, at most about 80°, at most about 60°, at most about 40°, or at most about 20°). In some embodiments, the angle θ is about 60°. In certain embodiments, an angle θ of one V-shaped portion can be different from an angle θ of another V-shaped portion. In certain embodiments, an angle θ of one V-shaped portion can be the same as an angle θ of another V-shaped portion. When photovoltaic module 700 is not used, it can be folded into a compact form, which can be easily stored or carried. FIG. 8 shows a cross-sectional view of a folded photovoltaic module 700.

In general, each of tandem photovoltaic cells 710 and 720 contains one or more photoactive materials. In some embodiments, a photoactive material in tandem photovoltaic cells 710 has a maximum absorption wavelength that is the same as that of a photoactive material in tandem photovoltaic cells 720. In certain embodiments, a photoactive material in tandem photovoltaic cells 710 has a maximum absorption wavelength at least 25 nm (e.g., at least about 50 nm, at least about 100 nm, at least about 150 nm, at least about 200 nm, at least about 250 nm, at least about 300 nm, at least about 350 nm, at least about 400 nm, or at least about 450 nm) different from that of a photoactive material in tandem photovoltaic cells 720.

In some embodiments, each of tandem photovoltaic cells 710 and 720 contains at least two electrodes. The electrodes in a tandem photovoltaic cell can be identical or different. In certain embodiments, at least one of the electrode in tandem photovoltaic cell 710 or 720 can be formed of a transparent electrically conductive material. Examples of such materials include certain metal oxides, such as indium tin oxide (ITO), tin oxide, a fluorine-doped tin oxide, and zinc-oxide. In some embodiments, at least one of the electrodes in tandem photovoltaic cell 710 or 720 can be formed of a metal mesh or a metal foil. Suitable metals that can be used to form the mesh or foil include palladium, titanium, platinum, stainless steel, and alloys thereof. In certain embodiments, at least one of the electrodes of a photovoltaic cell can be formed of a material different from that of at least one of the electrodes of a different photovoltaic cell. In some embodiments, a tandem photovoltaic cell 710 can share an electrode with a tandem photovoltaic cell 720. For example, tandem photovoltaic cells 710 and 720 can share an electrode located at the bottom of each cell (i.e., between a substrate and other components of photovoltaic cell 710 or 720). Such photovoltaic module can be prepared by depositing a shared electrode on a substrate, and then depositing other components of photovoltaic cell 710 or 720 on the shared electrode.

In some embodiments, each tandem photovoltaic cell 710 or 720 can include two or more semi-cells (e.g., three, four, five, six, seven, eight, nine, or ten semi-cells).

In some embodiments, each of tandem photovoltaic cells 710 and 720 can contain an anti-reflective (or anti-reflection; AR) coating on its surface. Without wishing to be bound by theory, it is believed that such an AR coating on a photovoltaic cell can minimize the amount of incident light that is reflected on the surface of the photovoltaic cell, thereby increasing the amount of the incident light available for absorption by the photovoltaic cell.

In some embodiments, an AR coating can consist of a single quarter-wave layer of a transparent material, whose refractive index is the square root of the substrate's refractive index. Such an AR coating can give zero reflectance at the center wavelength and gradually increased reflectance for wavelengths in a broad band around the center. An example of a substrate includes optical glass (e.g., crown glass or bare glass). In certain embodiments, the substrate can have a refractive index at least about 1.3 (e.g., at least about 1.4, at least about 1.5, at least about 1.6, at least about 1.7, at least about 1.8, or at least about 1.9). In some embodiments, a single-layer AR coating can be formed of magnesium fluoride (MgF$_2$), which has a refractive index of 1.38. A MgF$_2$ coating typically has about 1% reflectance on crown glass and about 4% reflectance on bare glass. In general, when a MgF$_2$ coating is used for a wavelength in the middle of the visible spectrum, it gives good antireflection over the entire visible spectrum.

In some embodiments, an AR coating is formed of transparent thin film structures with alternating layers of contrasting refractive index. Layer thicknesses can be chosen to produce destructive interference in the beams reflected from the interfaces, and constructive interference in the corresponding transmitted beams. This makes the structure's performance change with the wavelength and incident angle (as in diffraction). Thus, such a coating is typically designed for a particular wavelength range (e.g., in the IR, visible or UV region). In certain embodiments, an AR coating can contain alternative layers of a low-index material (e.g., silica) and a high-index material. Such an AR coating can have reflectance as low as 0.1% at a single wavelength. In some embodiments, an AR coating can have unique characteristics, such as near-zero reflectance at multiple wavelengths, or optimum performance at an incidence angles other than 0°.

In some embodiments, each of tandem photovoltaic cells 710 and 720 can be a tandem photovoltaic cell described in FIGS. 1 and 4 above. If desired, different tandem photovoltaic cells in photovoltaic module 700 can be of different types of cells. For example, in a V-shaped portion of photovoltaic module 700, tandem photovoltaic cells 710 can include only organic photoactive materials and tandem photovoltaic cells 720 can include both organic and inorganic photoactive materials.

In some embodiments, photovoltaic module 700 can be manufactured by first preparing a plurality of tandem photovoltaic cells on a flexible substrate using a roll-to-roll process and then partial slitting the flexible substrate to form to a plurality of V-shaped portions, each of which contains two tandem photovoltaic cells. Examples of slitting methods are disclosed in co-pending and commonly owned U.S. Ser. No. 10/351,250, which is hereby incorporated by reference.

In some embodiments, geometries other than V-shape (e.g., a parabolic shape or a semi-spherical shape) can also be used in a photovoltaic module. Examples of other geometries are disclosed in co-pending and commonly owned U.S. Application Publication No. 2006-0225778, which is hereby incorporated by reference.

While certain embodiments have been disclosed, other embodiments are also possible.

In some embodiments, the semi-cells in a tandem cell are electrically interconnected in series. When connected in series, in general, the layers can be in the order shown in FIG. 1. In certain embodiments, the semi-cells in a tandem cell are electrically interconnected in parallel. When interconnected in parallel, a tandem cell having two semi-cells can include the following layers: a first cathode, a first hole carrier layer, a first photoactive layer, a first hole blocking layer (which can serve as an anode), a second hole blocking layer (which can serve as an anode), a second photoactive layer, a second hole carrier layer, and a second cathode. In such embodiments, the first and second hole blocking layers can be either two separate layers or can be one single layer. In case the conductivity of the first and second hole blocking layer is not sufficient, an additional layer (e.g., an electrically conductive mesh layer) providing the required conductivity may be inserted.

In some embodiments, a tandem cell can include more than two semi-cells (e.g., three, four, five, six, seven, eight, nine, or ten semi-cells). In certain embodiments, some semi-cells can be electrically interconnected in series and some semi-cells can be electrically interconnected in parallel.

While photovoltaic cells have been described above, in some embodiments, the polymers described herein can be used in other devices and systems. For example, the polymers can be used in suitable organic semiconductive devices, such as field effect transistors, photodetectors (e.g., IR detectors), photovoltaic detectors, imaging devices (e.g., RGB imaging devices for cameras or medical imaging systems), light emitting diodes (LEDs) (e.g., organic LEDs or IR or near IR LEDs), lasing devices, conversion layers (e.g., layers that convert visible emission into IR emission), amplifiers and emitters for telecommunication (e.g., dopants for fibers), storage elements (e.g., holographic storage elements), and electrochromic devices (e.g., electrochromic displays).

The following examples are illustrative and not intended to be limiting.

Example 1

Synthesis of 4,4-Bis-(2-ethyl-hexyl)-4H-cyclopenta[2,1-b; 3,4-b']dithiophene

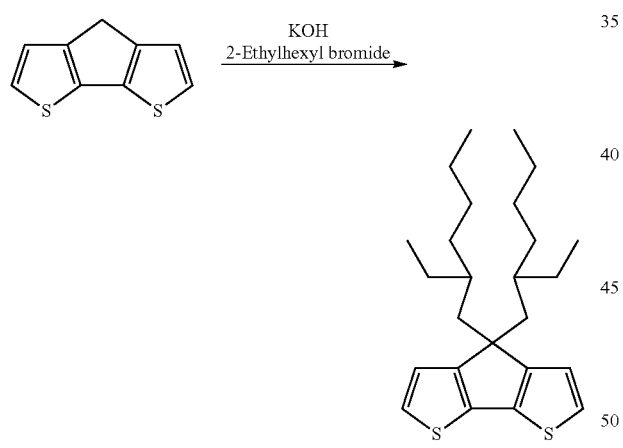

4H-Cyclopenta[2,1-b; 3,4-b']dithiophene (1.5 g, 0.00843 mol) was dissolved in DMSO (50 mL). After the solution was purged with nitrogen, and grounded KOH (1.89 g, 0.0337 mol), sodium iodide (50 mg), and 2-ethylhexyl bromide (3.25 g, 0.0169 mol) were sequentially added. The reaction mixture was stirred overnight under nitrogen (c.a. 16 hours). Water was added and the reaction was extracted with t-butylmethyl ether. The organic layer was collected, dried over magnesium sulfate, and concentrated. The residue was purified by chromatography using hexanes as eluent. Fractions containing pure 4,4-Bis-(2-ethyl-hexyl)-4H-cyclopenta[2,1-b; 3,4-b'] dithiophene product were combined and concentrated. The product was obtained as a colorless oil after drying under vacuum. Yield: 2.68 g (79%). $^1$H NMR (CDCl$_3$, 250 MHz): 7.13 (m, 2H), 6.94 (m, 2H), 1.88 (m, 4H), 0.94 (m, 16H), 0.78 (t, 6.4 Hz, 6H), 0.61 (t, 7.3 Hz, 6).

Example 2

Synthesis of 4,4-Bis-(2-ethyl-hexyl)-2,6-bis-trimethylstannanyl-4H-cyclopenta[2,1-b; 3,4-b']dithiophene

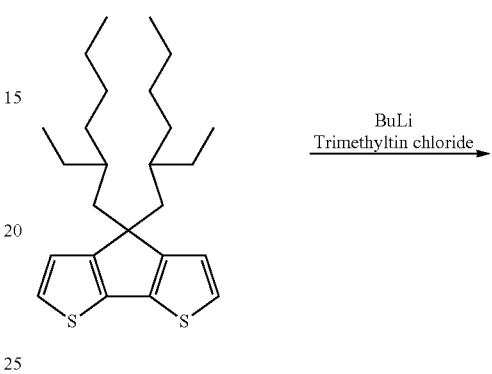

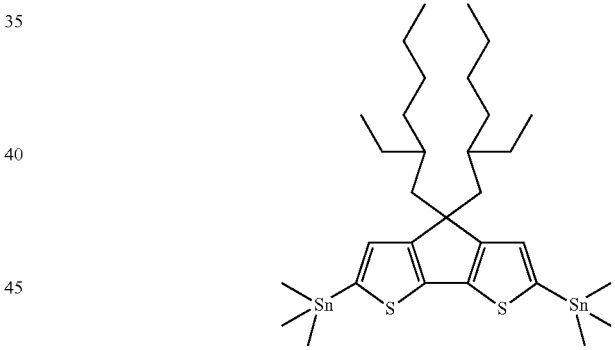

Starting material 4,4-Bis-(2-ethyl-hexyl)-4H-cyclopenta[2,1-b; 3,4-b']dithiophene (1.5 g, 0.00372 mol) was dissolved in dry THF (20 mL). After the solution was cooled to −78° C., butyl lithium (5.21 mL, 0.0130 mol) was added dropwise. The reaction mixture was stirred at this temperature for 1 hour. It was then warmed to room temperature and stirred for another 3 hours. The mixture was again cooled to −78° C. and trimethyltin chloride (1 M in hexane, 15.6 mL, 15.6 mmol) was added dropwise. The reaction mixture was allowed to warm to room temperature and stirred overnight (c.a. 16 hours).

Water was added and the reaction was extracted with toluene. The organic layer was washed with water, dried over sodium sulfate, and concentrated. The residue was dissolved in toluene, and quickly passed through a small plug of silica gel pretreated with triethylamine. The solvent was removed and the residue was dried under vacuum, 1.25 g of the product was obtained. $^1$H NMR (CDCl$_3$, 250 MHz): 6.96 (m, 2H), 1.85 (m, 4H), 1.29 (m, 2H), 0.92 (m, 16H), 0.78 (t, 6.8 Hz, 6H), 0.61 (t, 7.3 Hz, 6H), 0.38 (m, 18H).

Example 3

Polymerization of Bis-(trimethylstannyl)-4,4-Di(2-ethylhexyl)-cyclopenta[2,1-b:3,4-b']dithiophen and 4,7-dibromo-2,1,3-benzothiadiazole

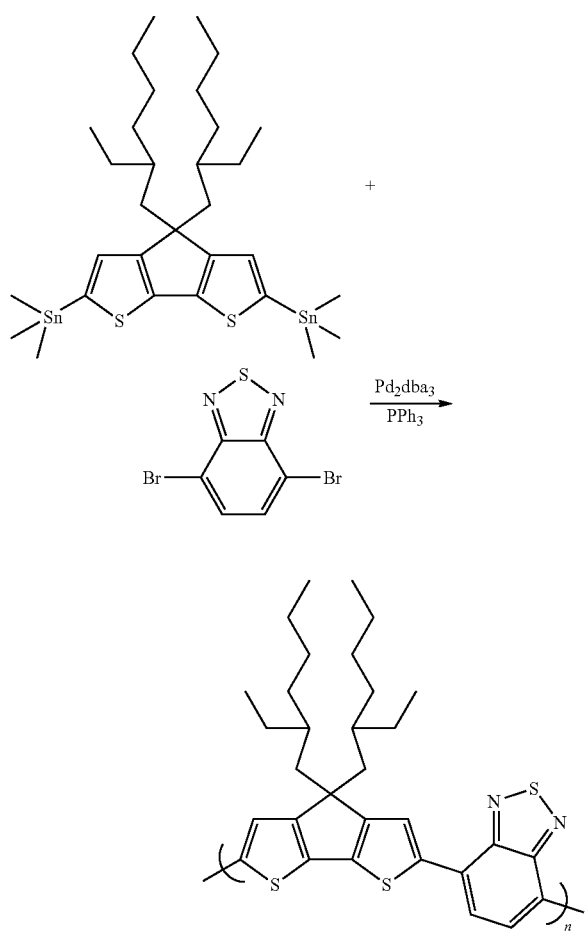

Bis-(trimethylstannyl)-4,4-di(2-ethylhexyl)-cyclopenta[2,1-b:3,4-b']dithiophene (0.686 g, 0.000943 mol) and 4,7-dibromo-2,1,3-benzothiadiazole (0.269 g, 0.000915 mol) were dissolved in toluene (20 mL). After the reaction was purged with nitrogen, tris(dibenzylideneacetone)dipalladium(0) (25.1 mg, 0.0275 mmol) and triphenylphosphine (57.6 mg, 0.220 mmol) were added. The reaction was further purged with nitrogen for 10 minutes and heated to 120° C. under nitrogen for 24 hours. The solvent was removed under vacuum and the residue was dissolved in chloroform. After the mixture was poured into methanol (500 mL), the blue precipitate thus obtained was collected by filtration, washed with methanol, and dried. The precipitate was dissolved in chloroform (30 mL) under heating, and filtered through a 0.45 μm membrane. The solution was loaded on to recycling HPLC (2H+2.5H column on a Dychrome recycling HPLC, 5 cycles for each injection), in 3 mL portions for purification. Higher-molecular-weight fractions were combined to give 120 mg pure polymer (Mn=35 kDa).

Example 4

Synthesis of bis-(5,5'-trimethylstannyl)-3,3'-di-n-hexyl-silylene-2,2'-dithiophene

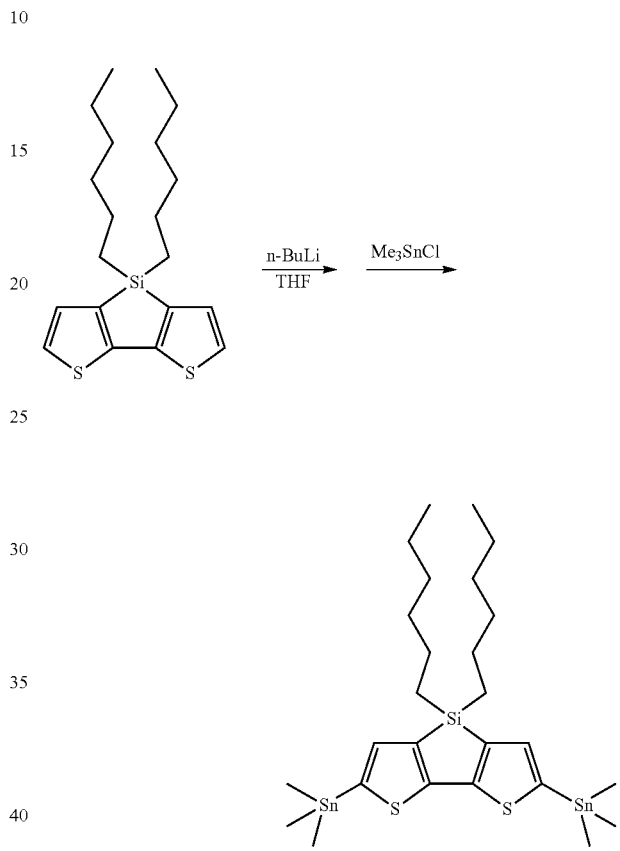

0.638 g (1.76 mmol) of 3,3'-di-n-hexylsilylene-2,2'-dithiophene (prepared according to the procedures described in Usta et al., *J. Am. Chem. Soc.*, 2006; 128(28); 9034-9035, the contents of which are hereby incorporated by reference) was dissolved in 20 mL of freshly distilled dry THF. The solution was purged with nitrogen for 15 minutes and cooled to −78° C. 4.00 mL of n-butyl lithium in hexane (10 mmol) was added to this solution dropwise. The solution was allowed to react for two hours at this temperature. The solution was then warmed to room temperature and allowed to react for additional two and half hours. After the solution was subsequently cooled down to −78° C., 12.00 ml (12.00 mmol) of trimethyltin chloride in hexane was added into the solution dropwise. The reaction solution was stirred at −78° C. for two more hours. The solution was then warmed to room temperature and allowed to react for 16 more hours. Upon the completion of reaction, 100 ml of distilled water was added and the solution was extracted using toluene (3×60 ml). The combined organic phase was washed with distilled water (3×150 ml) and dried over sodium sulfate. The organic solvent was removed via rotary evaporation under vacuum. The residue was dissolved in toluene and quickly passed through a silica-gel pad pretreated with triethyl amine. The organic solvent was removed under vacuum to give the title compound (1.048 g). The yield was about 86.50%. $^1$H NMR in CDCl$_3$: 7.00 (m, 2H), 1.25-1.42 (m, 16H), 0.86-0.94 (m, 10H), and 0.38 (m, 18H).

Example 5

Polymerization of bis-(5,5'-trimethylstannyl)-3,3'-di-n-hexyl-silylene-2,2'-dithiophene and 4,7-dibromo-2,13-benzothiadiazole

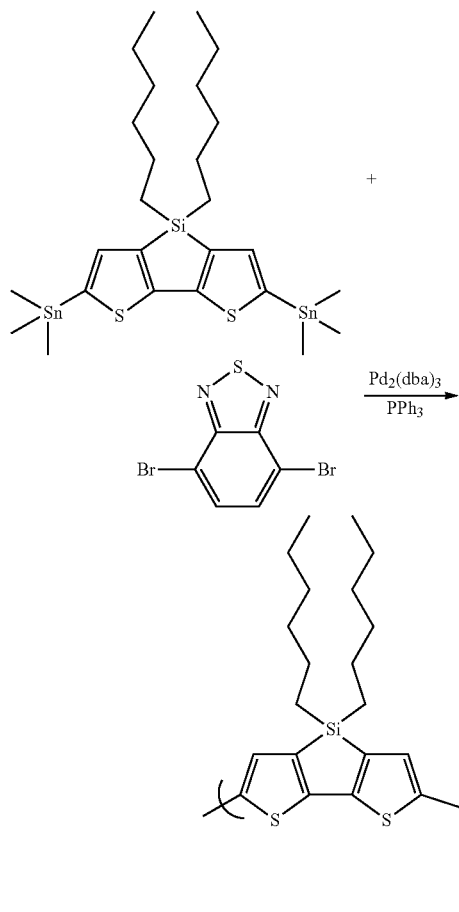

0.353 g (0.513 mmol) of bis-(5,5'-trimethylstannyl)-3,3'-di-n-hexyl-silylene-2,2'-dithiophene and 0.135 g (0.500 mmol) (monomer ratio=1.025) of 4,7-dibromo-2,1,3-benzothiadiazole were dissolved in 12 mL of anhydrous toluene. After the solution was purged with nitrogen, 12.55 mg (0.014 mmol) of tris(dibenzylideneacetone)dipalladium (0) and 28.80 mg (0.110 mmol) of triphenylphosphine were added. The solution was further purged with nitrogen for 15 minutes. The solution was then heated up to 110-120° C. and allowed to react for 40 hours. Upon the completion of the reaction, the solvent was removed via rotary evaporation. The resultant residue was dissolved in about 30 mL of chlorobenzene. After the chlorobenzene solution was poured into 600 mL of methanol, a deep blue precipitate thus obtained (the crude polymer product) was collected through filtration. The collected solid was redissolved in about 40 mL of chlorobenzene during heating. The chlorobenzene solution was filtered through a 0.45μ membrane, and poured into 600 mL of methanol. After the dark blue color polymer product thus obtained was collected through filtration, it was washed with methanol (3×100 ml) and dried under vacuum.

The dried polymer product was redissolved in 60 ml of hot chlorobenzene and poured into 60 mL of 7.5% sodium diethyldithiocarbamate trihydrate (DDC) aqueous solution. The solution was purged by nitrogen for 15 minutes. The mixed two phase solution thus obtained was heated at about 80° C. and stirred vigorously under nitrogen for 15 hours. After the organic phase was washed with hot distilled water (3×60 ml), it was slowly poured into 800 mL of methanol. The precipitate was collected through filtration. The collected polymer product was first extracted with acetone and methanol each for 12 hours through Soxhlet extraction apparatus. The polymer product was then collected and dried. The molecular weight distribution of the polymer product was analyzed using HPLC through a GPC column with polystyrene as a reference (HPLC Instrument: Agilent Technologies, Model No. 1090M. HPLC Column: PL Gel 10M Mixed B. Solvent used: Chlorobenzene). The measured molecular weight distributions are: $M_n$=4,000 and $M_w$=5,000. $\lambda_{max.}$ (nm)(in chlorobenzene)=641 nm. $\lambda_{max.}$ (nm)(thin film)=673 nm.

HOMO (eV)=−5.47 (from electrochemical measurement), LUMO (eV)=−3.69 (from electrochemical measurement), and 1.78 eV for the value of band gap (calculated from electrochemical measurement results).

Example 6

Polymerization of bis-(5,5'-trimethylstannyl)-3,3'-di-n-hexyl-silylene-2,2'-dithiophene and 3-hexyl-2,5-dibromo-thiophene

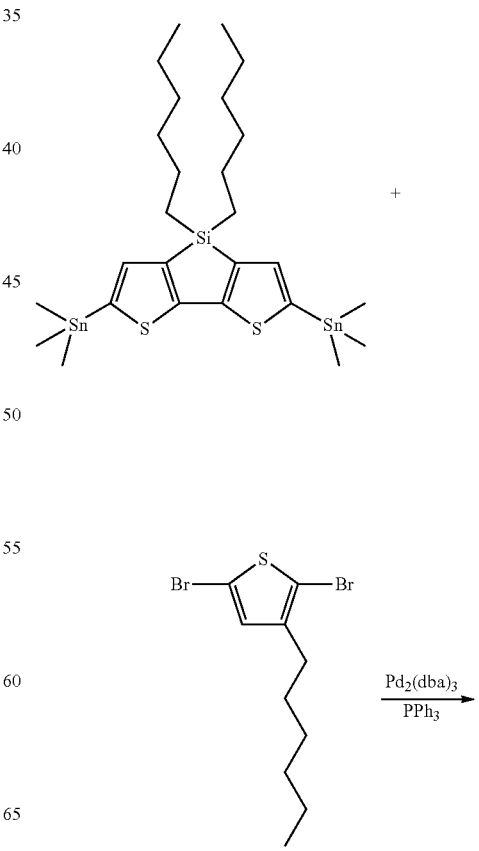

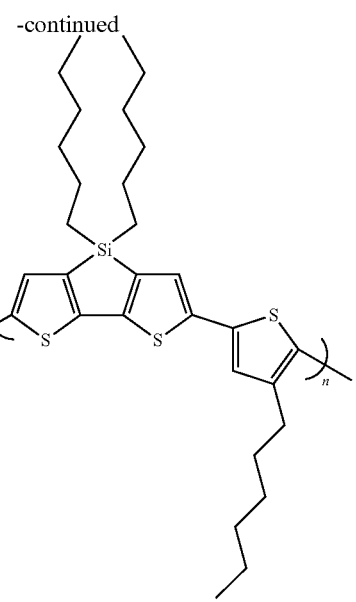

0.353 g (0.513 mmol) of bis-(5,5'-trimethylstannyl)-3,3'-di-n-hexyl-silylene-2,2'-dithiophene and 0.163 g (0.500 mmol) (monomer ratio=1.025) of 3-hexyl-2,5-dibromothiophene were dissolved in 12 mL of anhydrous toluene. After the solution was purged with nitrogen, 12.55 mg (0.014 mmol) of tris(dibenzylideneacetone) dipalladium (0) and 28.80 mg (0.110 mmol) of triphenylphosphine were added. The solution was further purged with nitrogen for 15 minutes. The solution was then heated up to 110-120° C. and allowed to react for 40 hours. Upon the completion of the reaction, the solvent was removed via rotary evaporation. The resultant residue was washed with methanol (50 mL×3), and then washed with of acetone (3×50 ml). The residue of the polymer product was collected as dark red-purple solid. The collected polymer product was redissolved in about 60 mL of chloroform under heating. After the chloroform solution was filtered through a 0.45μ membrane, the solvent was removed via rotary evaporation under vacuum. The polymer product was then dried under vacuum.

The dried polymer product was redissolved in 60 ml of hot toluene. The solution was poured into 60 mL of 7.5% DDC aqueous solution. The solution was purged by nitrogen for 15 minutes. The mixed two phase solution thus obtained was heated at about 80° C. and stirred vigorously under nitrogen protection for 12 hours. After the organic phase was then washed with hot distilled water (3×60 ml), the organic phase was collected and dried over anhydrous magnesium sulfate. The solvent was removed to give a solid polymer product. The solid polymer product was sequentially extracted with methanol and acetone for 12 hours each through Soxhlet extraction apparatus. Finally, the polymer product was collected and dried. The molecular weight distribution of the polymer was analyzed using HPLC through a GPC column with polystyrene as a reference (HPLC Instrument: Agilent Technologies, Model No. 1090M. HPLC Column: PL Gel 10M Mixed B. Solvent used: Chlorobenzene). The measured molecular weight distributions are: $M_n$=10,000 and $M_w$=13,500. $\lambda_{max.}$ (nm)(in chlorobenzene)=501 nm. $\lambda_{max.}$ (nm)(thin film)=503 nm.

Example 7

Polymerization of bis-(5,5'-trimethylstannyl)-3,3'-di-n-hexyl-silylene-2,2'-dithiophene, 4,7-dibromo-2,13-benzothiadiazole, and 3-hexyl-2,5-dibromothiophene

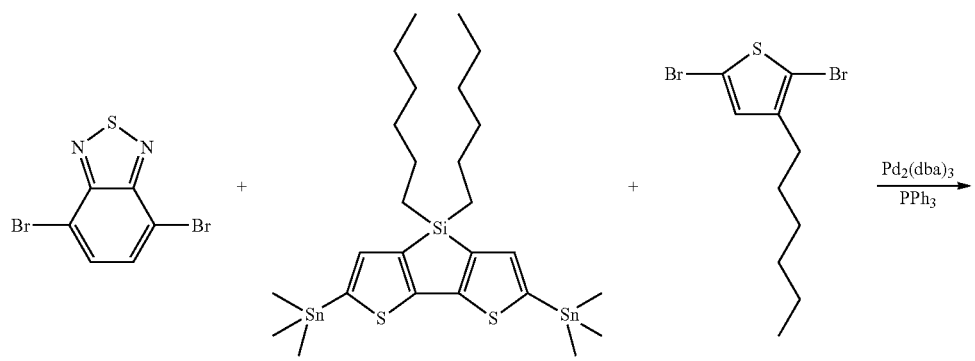

-continued

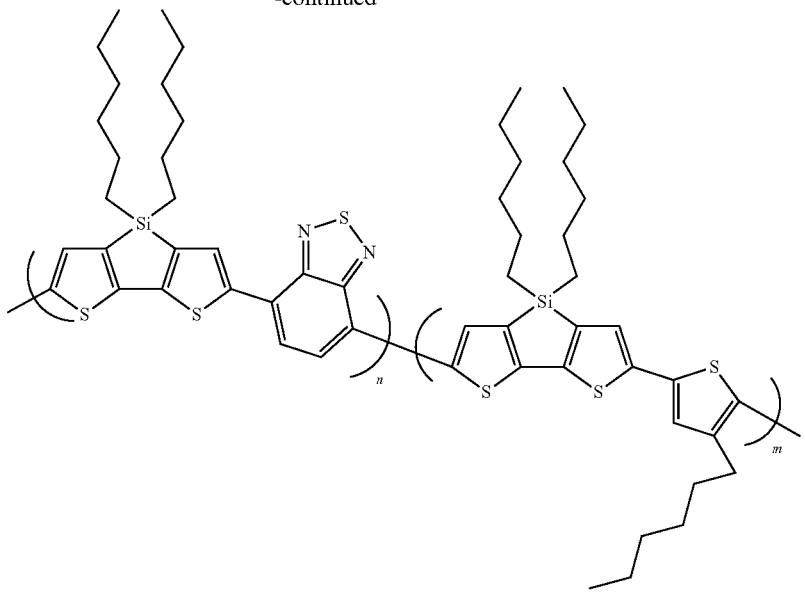

n = m = 1:1

0.310 g (0.450 mmol) of bis-(5,5'-trimethylstannyl)-3,3'-di-n-hexyl-silylene-2,2'-dithiophene, 0.068 g (0.225 mmol) (monomer ratio=1.025) of 4,7-dibromo-2,1,3-benzothiadiazole, and 0.073 g (0.225 mmol) of 3-hexyl-2,5-dibromothiophene (monomer ratio=2:1:1) were dissolved in 12 mL of anhydrous toluene. After the solution was purged with nitrogen, 12.55 mg (0.014 mmol) of tris(dibenzylideneacetone)dipalladium (0) and 28.80 mg (0.110 mmol) of triphenylphosphine were added. The solution was further purged with nitrogen for 15 minutes. The solution was then heated up to 110-120° C. and allowed to react for 40 hours. Upon the completion of the reaction, the solvent was removed via rotary evaporation. The resultant residue was dissolved in about 30 mL of chlorobenzene. After the solution was poured into 600 mL of methanol, deep blue-black precipitate was collected through filtration. The collected solid polymer product was then redissolved in about 40 mL of chlorobenzene under heating. After the chlorobenzene solution was filtered through a 0.45µ membrane, it was poured into 600 mL of methanol. The dark blue-black color polymer product was collected again through filtration. The solid polymer product was washed with methanol (3×100 ml) and dried under vacuum.

The dried polymer product was redissolved in 60 ml of hot chlorobenzene and poured into 60 mL of 7.5% DDC aqueous solution. The solution was purged by nitrogen for 15 minutes. The mixed two phase solution thus obtained was heated at about 80° C. and stirred vigorously under nitrogen protection for 15 hours. The organic phase was then washed by hot distilled water (3×60 ml). After the chlorobenzene solution was slowly poured into 800 ml of methanol, the precipitate thus obtained was collected through filtration. The collected solid polymer product was sequentially extracted with acetone and methanol for 12 hours each through Soxhlet extraction apparatus. The polymer product was then collected and dried. The molecular weight distribution of the polymer was analyzed using HPLC through a GPC column with polystyrene as a reference (HPLC Instrument: Agilent Technologies, Model No. 1090M. HPLC Column: PL Gel 10M Mixed B. Solvent used: Chlorobenzene). The measured molecular weight distributions are: $M_n$=7,500 and $M_w$=10,400. $\lambda_{max.}$ (nm)(in chlorobenzene)=595 nm. $\lambda_{max.}$ (nm)(thin film)=649 nm.

Example 8

Polymerization of bis-(5,5'-trimethylstannyl)-3,3'-di-n-hexyl-silylene-2,2'-dithiophene and 5,5'-bis(5-bromo-2-thienyl)-4,4'-dihexyl-2,2'-bithiazole

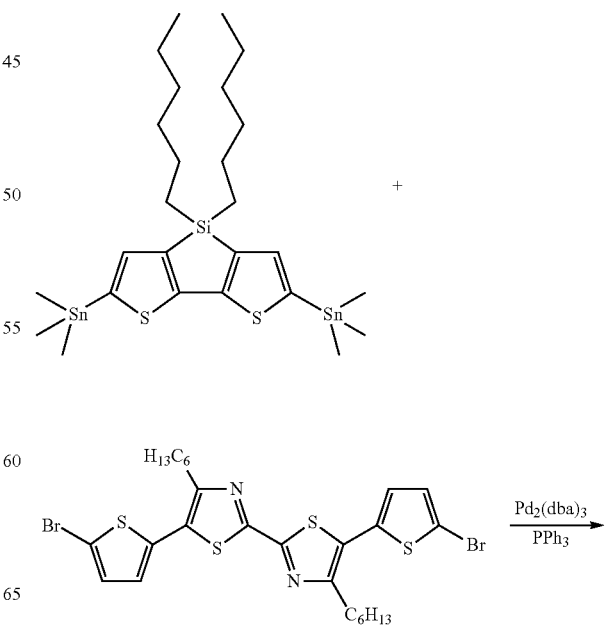

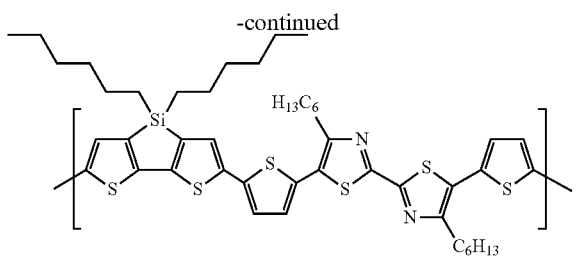

A 100 mL Schlenk flask was charged with 0.045 g (0.0654 mmol) of bis-(5,5'-trimethylstannyl)-3,3'-di-n-hexyl-silylene-2,2'-dithiophene, 0.043 g (0.0654 mmol) of 5,5'-bis(5-bromo-2-thienyl)-4,4'-dihexyl-2,2'-bithiazole, 1.0 mg (0.00109 mmol) of $Pd_2dba_3$, and 2.0 mg (0.0076 mmol) of $PPh_3$. The flask was evacuated and refilled with argon three times. The solids were dissolved in 3 mL of o-xylene and the solution was heated to 95° C. for 24 hours. The solution was then cooled, poured into 500 mL of stirring MeOH, and filtered. The dark precipitate thus obtained was washed with MeOH, dried under vacuum to give a brown solid (0.069 g). Mn=3.7 kDa. Mw=4.6 kDa.

Example 9

Preparation of 2,6-bis(4,4,5,5-tetramethyl-1,3,2-dioxaborolan-2-yl)-4H-4,4-bis(2'-ethylhexyl)cyclopenta[2,1-b:3,4-b']thiophene

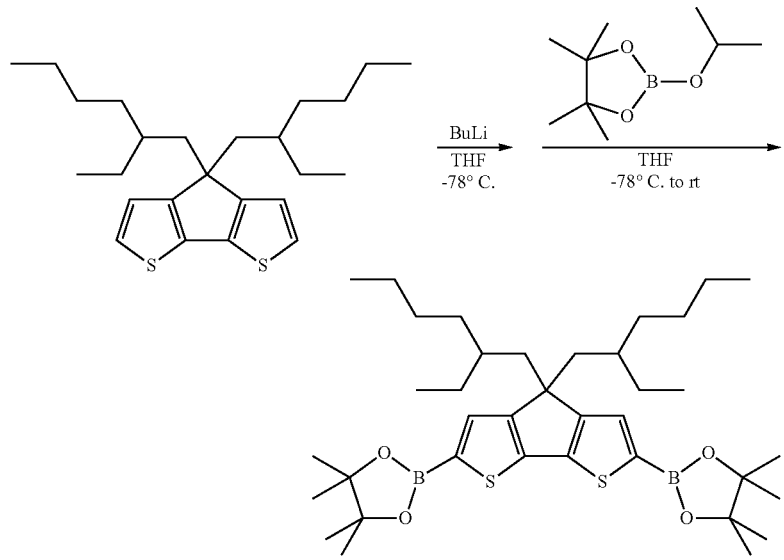

100 mL oven dried Schlenk flask was charged with 1.097 g (2.72 mmol) of 4H-4,4-bis(2'-ethylhexyl)cyclopenta[2,1-b:3,4-b']dithiophene. The flask was evacuated and purged with argon three times. To this flask was then added 20 mL of dry, distilled THF. The resulting solution was cooled to −78° C. and 4.35 mL (10.88 mmol, 4 equv.) of 2.5M BuLi was added dropwise. The reaction was stirred for 1 hour at −78° C. and then warmed to room temperature and stirred for an additional 3 hours. The solution was cooled again to −78° C. and 2.77 mL (13.6 mmol, 5 equiv.) of 2-isopropoxy-4,4,5,5-tetramethyl-1,3,2-dioxaborolane was added in one portion via syringe. The reaction was stirred at −78° C. for 1 hour and then allowed to warm to room temperature overnight. The solution was poured into water and extracted with 4×150 mL of methyl tert-butyl ether. The organic layers were combined and washed with 2×150 mL of brine, dried with anhydrous $MgSO_4$, and filtered. The solvent was removed under vacuum to yield and orange oil, which was purified by column chromatography (5% EtOAc in hexanes) to yield a colorless, viscous oil, 1.34 g (75% yield).

Example 10

Polymerization of 2,6-bis(4,4,5,5-tetramethyl-1,3,2-dioxaborolan-2-yl)-4H-4,4-bis(2'-ethylhexyl)cyclopenta[2,1-b:3,4-b']thiophene and 5,5'-bis(5-bromo-2-thienyl)-4,4'-dihexyl-2,2'-bithiazole

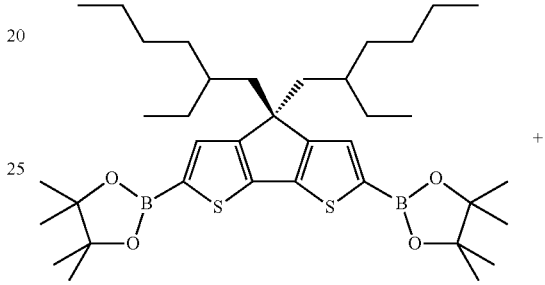

+

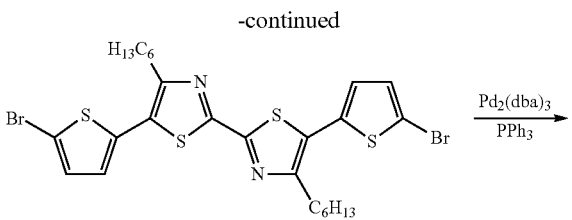

-continued

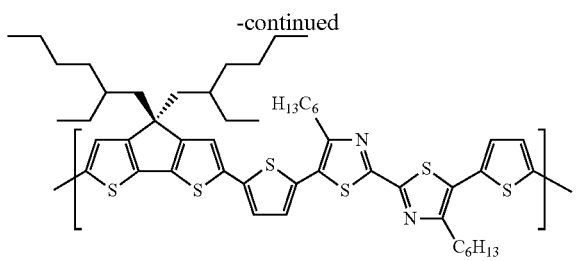

A 100 mL Schlenk flask was charged with 0.1515 g (0.231 mmol) of 2,6-bis(4,4,5,5-tetramethyl-1,3,2-dioxaborolan-2-yl)-4H-4,4-bis(2'-ethylhexyl)cyclopenta[2,1-b:3,4-b']thiophene, 0.152 g (0.231 mmol) of 5,5'-bis(5-bromo-2-thienyl)-4,4'-dihexyl-2,2'-bithiazole, 2.1 mg Pd$_2$dba$_3$ (0.00231 mmol), 4.2 mg PPh$_3$ (0.0162 mmol), and 35 mg (0.0855 mmol) of Aliquat 336. The flask, which was fitted with a condenser, was then evacuated and refilled with argon three times. The reagents were dissolved in a mixture of 20 mL of THF and 15 mL of toluene. 2 mL of a 2M Na$_2$CO$_3$ aqueous solution was added to the above solution while stirring. The reaction was heated at 90° C. for 3 days. A 1 mL THF solution of 14 mg (0.1155 mmol) of phenylboronic acid and 1.6 mg (0.00231 mmol) of PdCl$_2$(PPh$_3$)$_2$ was added. Heating was continued for an additional 24 hours. After the reaction was then cooled to 80° C., 10 mL of a 7.5% sodium diethyldithiocarbamate solution in water was added. The mixture was heated at 80° C. with stirring for 18 hours. After the reaction was cooled, the organic layer was separated and washed with warm water (3×100 mL). The toluene solution was concentrated and then poured into 750 mL of stirring MeOH. After the solution was filtered, the dark precipitate was collected and washed with MeOH. The precipitate was then transferred to a Soxhlet thimble and washed with acetone overnight. The product thus obtained was dried under vacuum to give 0.176 g of brown solid (0.195 mmol, 84%). $^1$H NMR (200 MHz, CDCl$_3$): δ 7.2-7.1 (br, 6H), 3.0 (m, 4H), 1.86 (m, 8H), 1.6 (br, 16H), 1.20-0.65 (br, 32H).

Example 11

Fabrication of Solar Cell

The polymer solar cells were fabricated by doctor-blading a blend of the polymer prepared in Example 3 (PCPDTBT) and PC$_{61}$BM or PC$_{71}$BM (purchased from Nano-C, Westwood, Mass.) in a 1:3 w/w ratio sandwiched between a transparent anode and an evaporated metal cathode. The transparent anode was an indium tin oxide (ITO)-covered glass substrate (Merck, Whitehouse Station, N.J.) which was coated with a ~60 nm thick PEDOT:PSS layer (Baytron PH from H.C. Starck) applied by doctorblading. The ITO-glass-substrate was cleaned by ultrasonification subsequently in acetone, isopropyl alcohol and deionized water. The cathode, a bilayer of a thin (1 nm) LiF layer covered with 80 nm Al, was prepared by thermal evaporation. PCPDTBT and PC$_{61}$BM or PC$_{71}$BM were dissolved together in o-dichlorobenzene (ODCB) to give an overall 40 mg/ml solution and was stirred overnight at 60-70° C. inside a glovebox. The active layer thickness, as determined by AFM, was between 150-250 nm. Device characterization was done under AM 1.5G irradiation (100 mW/cm$^2$) on an Oriel Xenon solar simulator with a well calibrated spectral mismatch of 0.98 jV-characteristics were recorded with a Keithley 2400. Active areas were in the range of 15 to 20 mm$^2$. EQE was detected with a lock-in amplifier under monochromatic illumination. Calibration of the incident light was done with a monocrystalline silicon diode. Mobility measurements were done using an Agilent 4155C parameter analyzer. Absorption measurements were done inside the glovebox with an Avantes fiberoptic spectrometer or outside with a HP spectrometer.

The interaction with PCBM and the photoinduced charge transfer was investigated by PL quenching. The PL of pristine PCPDTBT versus PCPDTBT/PCBM composites was measured at liquid N$_2$ temperatures in a cryostat, excitation was provided by an Ar laser at 488 nm.

Electrochemical experiments were carried out on dropcast polymer films at room temperature in a glovebox. The supporting electrolyte was tetrabutylammonium-hexafluorophosphate (TBAPF$_6$, electrochemical grade, Aldrich) ~0.1 M in acetonitrile anhydrous (Aldrich). The working electrode (WE), as well as the counter electrode (CE), was a platinum foil. A silver wire coated with AgCl was used as a reference electrode (RE). After each measurement, the RE was calibrated with ferrocene (E$^0$=400 mV vs. NHE) and the potential axis was corrected to NHE (using −4.75 eV for NHE$^{24,25}$) according to the difference of E$^0$ (ferrocene) and the measured E$^{1/2}$ (ferrocene). $\lambda_{max}$(CHCl$_3$)=710 nm, $\lambda_{band\ edge}$(CHCl$_3$)=780 nm, band gap (CHCl$_3$)=1.59 eV, $\lambda_{max}$(film)= 700-760 nm, $\lambda_{band\ edge}$(film)=855 nm, band gap (film)=1.45 eV, HOMO=−5.3 eV, −5.7 eV (electrochem), LUMO=−3.85 eV, −4.25 eV, μ$_+$=2×10$^{-2}$ cm$_2$/Vs (TOF), 1×10$^{-3}$ cm$^2$/Vs (FET).

Example 12

Fabrication of Tandem Solar Cell

A tandem photovoltaic cell having the structure of ITO/TiO$_2$/P3HT:PCBM/PEDOT/TiO2/P3HT:PCBM/PEDOT/Ag was prepared as follows. A substrate with ITO (having a resistivity of 13 ohm/square) was cleaned sequentially with acetone and isopropanol for 10 minutes in an ultrasonic bath at room temperature. Tetra-n-butyl-titanate (TYZOR; E.I. du Pont de Nemours and Company, Wilmington, Del.) diluted 1:199 in anhydrous isopropanol was applied onto the ITO via doctor-blading (40 mm/s; 600 μm slot at 40° C.) and hydrolyzed by distilled water. The coating thus obtained was dried for 10 minutes to give a titanium oxide layer having a thickness of 10±5 nm. A solution of poly-(3-hexylthiophen) (P3HT):C61-phenyl-butyric acid methyl ester (PCBM) in ortho-xylene (1.5 mg: 1.2 mg:100 μl) was then applied onto the titanium oxide layer via doctor-blading (7.5 mm/s; 600 μm slot at 65° C.) to give a P3HT:PCBM layer having a thickness of 100±10 nm. A solution of PEDOT in isopropanol (1 ml:5 ml) was subsequently coated on the P3HT:PCBM layer via doctor-blading (2×5 mm/s; 150 μm slot at 85° C.) to give in a PEDOT layer of 30±10 nm. After the device thus obtained was baked for 10 minutes at 140° C. in nitrogen atmosphere, tetra-n-butyl-titanate diluted 1:199 in anhydrous isopropanol was applied onto the PEDOT layer via doctor-blading (40 mm/s; 600 μm slot at 40° C.). The coating was hydrolyzed and dried for 10 minutes to give a second titanium oxide layer of 10±5 nm. The PEDOT layer and the second titanium oxide layer obtained above constituted as the recombination layer in the final tandem photovoltaic cell. A solution of P3HT:PCBM in ortho-xylene (1.5 mg:1.2 mg:100 μl) was then applied onto the second titanium oxide layer via doctor-blading (65 mm/s; 600 μm slot at 65° C.) to give a second P3HT:PCBM layer having a thickness of 300±30 nm. Subsequently, a solution of PEDOT in isopropanol (1 ml:5 ml) was applied onto the second P3HT:PCBM layer via doctor-blading (2×5 mm/s; 150 μm slot at 85° C.) to give a second PEDOT layer having a thickness of 30±10 nm. After the device thus obtained was baked for 20 minutes at 140° C. in nitrogen atmosphere, a 100 nm layer of silver was applied onto the second PEDOT layer via thermal evaporation (0.05-0.5 nm/s at $3\times10^{-6}$ mbar) to give a tandem photovoltaic cell.

A single photovoltaic cell having the structure of ITO/$TiO_2$/P3HT:PCBM/PEDOT/Ag was also prepared. The titanium oxide layer, the P3HT:PCBM layer, the PEDOT layer, and the silver layer were prepared using the same methods described in the preceding paragraph.

The tandem photovoltaic cell and single cell were tested for their properties. The open circuit voltage of both cells were measured at zero current using a Source Measurement Unit (SMU) Keithley 2400 when the device was illuminated by a solar simulator (Oriel) at 1 kW/m² Air Mass 1.5 global. The results show that the open circuit voltage of the tandem photovoltaic cell was 1.025 V, twice as much as that of a single photovoltaic cell having the structure of ITO/$TiO_2$/P3HT:PCBM/PEDOT/Ag.

Other embodiments are in the claims.

What is claimed is:

1. A system, comprising:
   first and second electrodes;
   a recombination layer between the first and second electrodes;
   a first photoactive layer between the first electrode and the recombination layer, the first photoactive layer consisting of a single layer that comprises a first organic electron donor material and a first organic electron acceptor material; and
   a second photoactive layer between the second electrode and the recombination layer, the second photoactive layer consisting of a single layer that comprises a second organic electron donor material and a second organic electron acceptor material;
   wherein at least one of the first and second organic electron donor materials comprises a polysilacyclopentadithiophene copolymer, the recombination layer comprises third, fourth, and fifth layers, the fifth layer is between the third and fourth layers, and the system is configured as a photovoltaic system; and
   wherein the polysilacyclopentadithiophene copolymer comprises a first comonomer repeat unit and a second comonomer repeat unit different from the first comonomer repeat unit, the first comonomer repeat unit comprises a silacyclopentadithiophene moiety; and the second comonomer repeat unit comprises a benzothiadiazole moiety, a thiadiazoloquinoaline moiety, a cyclopentadithiophene oxide moiety, a benzoisothiazole moiety, a benzothiazole moiety, a thiophene oxide moiety, a thienothiophene moiety, a thienothiophene oxide moiety, a dithienothiophene moiety, a dithienothiophene oxide moiety, a tetrahydroisoindole moiety, a fluorene moiety, a silole moiety, a cyclopentadithiophene moiety, a fluorenone moiety, a thiazole moiety, a selenophene moiety, a thiazolothiazole moiety, a cyclopentadithiazole moiety, a naphthothiadiazole moiety, a thienopyrazine moiety, a silacyclopentadithiophene moiety, an oxazole moiety, an imidazole moiety, a pyrimidine moiety, a benzoxazole moiety, or a benzimidazole moiety.

2. The system of claim 1, wherein the fifth layer comprises a metal oxide.

3. The system of claim 2, wherein the metal oxide comprises an oxide selected from the group consisting of titanium oxides, indium tin oxides, tin oxides, and zinc oxides.

4. The system of claim 1, wherein the fifth layer comprises metallic particles.

5. The system of claim 4, wherein the metallic particles comprise at least one material selected from the group consisting of iron, gold, silver, copper, aluminum, nickel, palladium, platinum, titanium and alloys thereof.

6. The system of claim 1, wherein the third layer comprises an n-type semiconductor material and the fourth layer comprises a p-type semiconductor material.

7. The system of claim 6, wherein the p-type semiconductor material comprises a polymer selected from the group consisting of polythiophenes, polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxalines, polybenzoisothiazoles, polybenzothiazoles, polythienothiophenes, poly(thienothiophene oxide)s, polydithienothiophenes, poly(dithienothiophene oxide)s, polytetrahydroisoindoles, and copolymers thereof.

8. The system of claim 7, wherein the p-type semiconductor material comprises poly(3,4-ethylene dioxythiophene).

9. The system of claim 6, wherein the p-type semiconductor material comprises a metal oxide.

10. The system of claim 9, wherein the metal oxide comprises an oxide selected from the group consisting of copper oxides, strontium copper oxides, strontium titanium oxides, and combinations thereof.

11. The system of claim 9, wherein the p-type semiconductor material comprises a p-doped metal oxide.

12. The system of claim 11, wherein the p-doped metal oxide comprises a p-doped zinc oxide or a p-doped titanium oxide.

13. The system of claim 6, wherein the n-type semiconductor material comprises a metal oxide.

14. The system of claim 13, wherein the metal oxide comprises an oxide selected from the group consisting of titanium oxides, zinc oxides, tungsten oxides, molybdenum oxides, and combinations thereof.

15. The system of claim 6, wherein the n-type semiconductor material comprises a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof.

16. The system of claim 6, wherein the third layer is between the first photoactive layer and the fifth layer.

17. The system of claim 16, further comprising a hole carrier layer between the first photoactive layer and the first electrode.

18. The system of claim 17, wherein the hole carrier layer comprises a polymer selected from the group consisting of polythiophenes, polyanilines, polyvinylcarbazoles, polyphenylenes, polyphenylvinylenes, polysilanes, polythienylenevinylenes, polyisothianaphthanenes, and copolymers thereof.

19. The system of claim 18, wherein the hole carrier layer comprises poly(3,4-ethylene dioxythiophene).

20. The system of claim 16, further comprising a hole blocking layer between the second photoactive layer and the second electrode.

21. The system of claim 20, wherein the hole blocking layer comprises a material selected from the group consisting of LiF, metal oxides, and combinations thereof.

22. The system of claim 21, wherein the hole blocking comprises a titanium oxide or a zinc oxide.

23. The system of claim 6, wherein the fifth layer comprises a semiconductive material or an electrically conductive material.

24. The system of claim 1, wherein at least one of the first and second organic electron acceptor materials comprise a material selected from the group consisting of fullerenes, oxadiazoles, discotic liquid crystals, carbon nanorods, polymers containing CN groups, polymers containing $CF_3$ groups, and combinations thereof.

25. The system of claim 24, wherein at least one of the first and second organic electron acceptor materials comprise a substituted fullerene.

26. The system of claim 25, wherein the substituted fullerene comprises PCBM.

27. The system of claim 1, wherein the first photoactive layer has a first band gap and the second photoactive layer has a second band gap different from the first band gap.

28. The system of claim 1, wherein at least one of the first and second electrodes comprises a mesh electrode.

29. The system of claim 1, wherein the system comprises a tandem photovoltaic cell.

30. The system of claim 1, wherein the first organic electron donor material is different from the second organic electron donor material.

31. The system of claim 1, wherein the first organic electron acceptor material is the same as the second organic electron acceptor material.

32. The system of claim 1, wherein the second comonomer repeat unit comprises a benzothiadiazole moiety of formula (2), a thiadiazoloquinoxaline moiety of formula (3), a cyclopentadithiophene dioxide moiety of formula (4), a cyclopentadithiophene monoxide moiety of formula (5), a benzoisothiazole moiety of formula (6), a benzothiazole moiety of formula (7), a thiophene dioxide moiety of formula (8), a cyclopentadithiophene dioxide moiety of formula (9), a cyclopentadithiophene tetraoxide moiety of formula (10), a thienothiophene moiety of formula (11), a thienothiophene tetraoxide moiety of formula (12), a dithienothiophene moiety of formula (13), a dithienothiophene dioxide moiety of formula (14), a dithienothiophene tetraoxide moiety of formula (15), a tetrahydroisoindole moiety of formula (16), a thienothiophene dioxide moiety of formula (17), a dithienothiophene dioxide moiety of formula (18), a fluorene moiety of formula (19), a silole moiety of formula (20), a cyclopentadithiophene moiety of formula (21), a fluorenone moiety of formula (22), a thiazole moiety of formula (23), a selenophene moiety of formula (24), a thiazolothiazole moiety of formula (25), a cyclopentadithiazole moiety of formula (26), a naphthothiadiazole moiety of formula (27), a thienopyrazine moiety of formula (28), a silacyclopentadithiophene moiety of formula (29), an oxazole moiety of formula (30), an imidazole moiety of formula (31), a pyrimidine moiety of formula (32), a benzoxazole moiety of formula (33), or a benzimidazole moiety of formula (34):

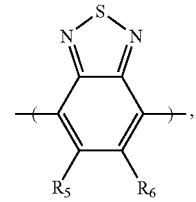
(2)

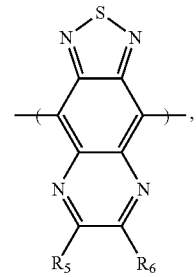
(3)

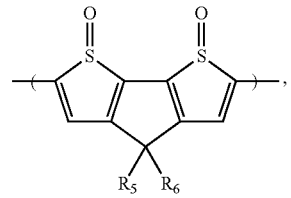
(4)

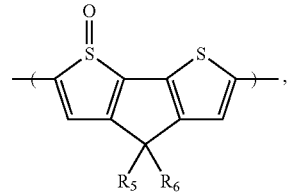
(5)

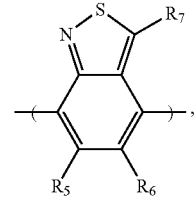
(6)

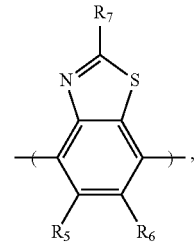
(7)

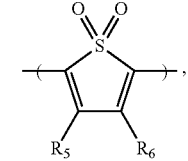
(8)

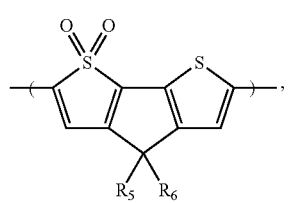  (9)
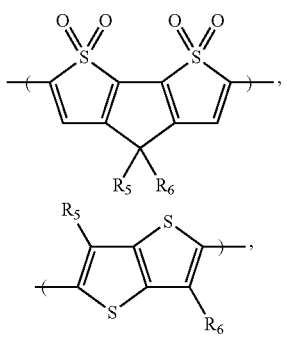  (10)
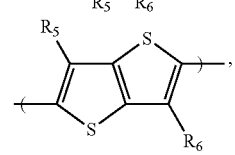  (11)
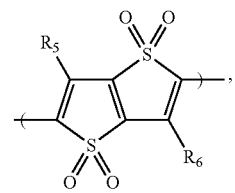  (12)
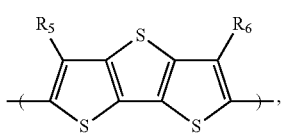  (13)
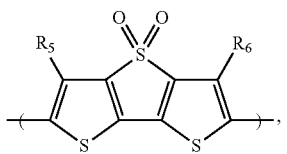  (14)
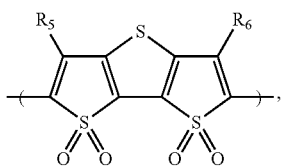  (15)
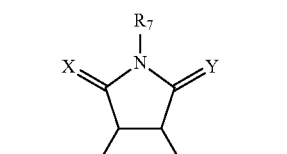  (16)
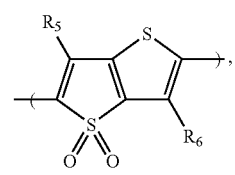  (17)
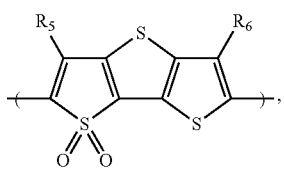  (18)
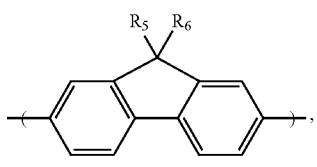  (19)
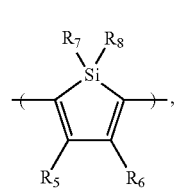  (20)
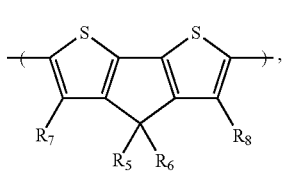  (21)
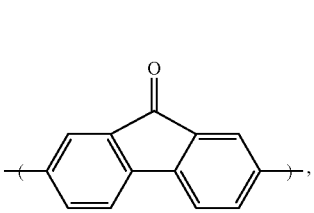  (22)
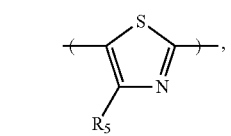  (23)
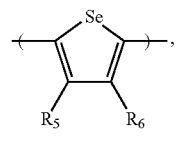  (24)
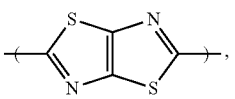  (25)
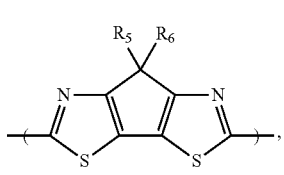  (26)

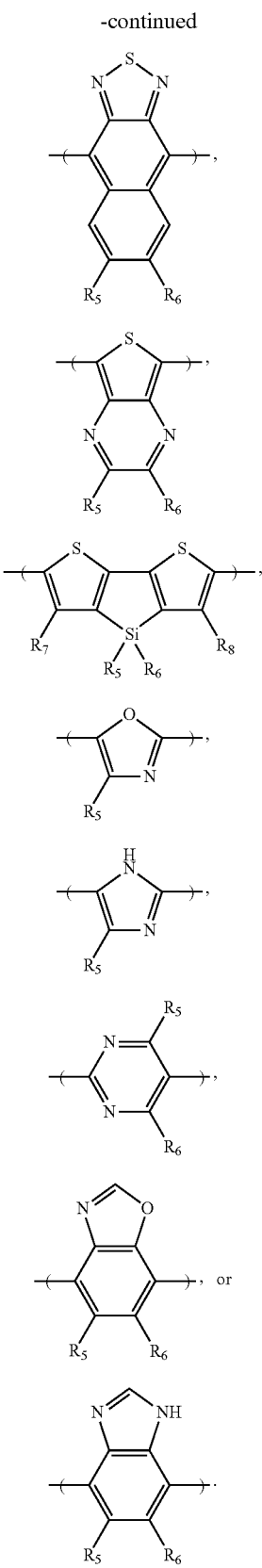

in which each of X and Y, independently, is CH$_2$, O, or S; each of R$_5$ and R$_6$, independently, is H, C$_1$-C$_{20}$ alkyl, C$_1$-C$_{20}$ alkoxy, C$_3$-C$_{20}$ cycloalkyl, C$_1$-C$_{20}$ heterocycloalkyl, aryl, heteroaryl, halo, CN, OR, C(O)R, C(O)OR, or SO$_2$R, in which R can be H, C$_1$-C$_{20}$ alkyl, C$_1$-C$_{20}$ alkoxy, aryl, heteroaryl, C$_3$-C$_{20}$ cycloalkyl, or C$_1$-C$_{20}$ heterocycloalkyl; and each of R$_7$ and R$_8$, independently, is H, C$_1$-C$_{20}$ alkyl, C$_1$-C$_{20}$ alkoxy, aryl, heteroaryl, C$_3$-C$_{20}$ cycloalkyl, or C$_3$-C$_{20}$ heterocycloalkyl.

33. The system of claim 32, wherein the second comonomer repeat unit comprises a benzothiadiazole moiety of formula (2) or a thiazolothiazole moiety of formula (25).

34. A system, comprising:
first and second electrodes;
a first photoactive layer between the first and second electrodes, the first photoactive layer consisting of a single layer that comprises a first organic electron donor material and a first organic electron acceptor material;
a second photoactive layer between the second electrode and the first photoactive layer, the second photoactive layer consisting of a single layer that comprises a second organic electron donor material and a second organic electron acceptor material; and
third, fourth, and fifth layers between the first and second photoactive layers, the fifth layer being between the third and fourth layers;
wherein at least one of the first and second organic electron donor materials comprises a polysilacyclopentadithiophene copolymer, the system is configured as a photovoltaic system and the third, fourth, and fifth layers are configured such that, during use, electrons generated in one of the first and second photoactive layers and holes generated in the other of the first and second photoactive layers are recombined at the fifth layer; and
wherein the polysilacyclopentadithiophene copolymer comprises a first comonomer repeat unit and a second comonomer repeat unit different from the first comonomer repeat unit, the first comonomer repeat unit comprises a silacyclopentadithiophene moiety; and the second comonomer repeat unit comprises a benzothiadiazole moiety, a thiadiazoloquinoaline moiety, a cyclopentadithiophene oxide moiety, a benzoisothiazole moiety, a benzothiazole moiety, a thiophene oxide moiety, a thienothiophene moiety, a thienothiophene oxide moiety, a dithienothiophene moiety, a dithienothiophene oxide moiety, a tetrahydroisoindole moiety, a fluorene moiety, a silole moiety, a cyclopentadithiophene moiety, a fluorenone moiety, a thiazole moiety, a selenophene moiety, a thiazolothiazole moiety, a cyclopentadithiazole moiety, a naphthothiadiazole moiety, a thienopyrazine moiety, a silacyclopentadithiophene moiety, an oxazole moiety, an imidazole moiety, a pyrimidine moiety, a benzoxazole moiety, or a benzimidazole moiety.

35. The system of claim 34, wherein the third layer comprises an n-type semiconductor material and the fourth layer comprises a p-type semiconductor material.

36. The system of claim 34, wherein the fifth layer comprises a semiconductive material or an electrically conductive material.

37. The system of claim 34, wherein at least one of the first and second electrodes comprises a mesh electrode.

38. The system of claim 34, wherein the system comprises a tandem photovoltaic cell.

39. The system of claim 34, wherein the fifth layer comprises metallic particles.

40. The system of claim 39, wherein the metallic particles comprise at least one material selected from the group consisting of iron, gold, silver, copper, aluminum, nickel, palladium, platinum, titanium and alloys thereof.

41. The system of claim 34, wherein the first organic electron donor material is different from the second organic electron donor material.

42. The system of claim 34, wherein the first organic electron acceptor material is the same as the second organic electron acceptor material.

43. The system of claim 34, wherein the second comonomer repeat unit comprises a benzothiadiazole moiety of formula (2), a thiadiazoloquinoxaline moiety of formula (3), a cyclopentadithiophene dioxide moiety of formula (4), a cyclopentadithiophene monoxide moiety of formula (5), a benzoisothiazole moiety of formula (6), a benzothiazole moiety of formula (7), a thiophene dioxide moiety of formula (8), a cyclopentadithiophene dioxide moiety of formula (9), a cyclopentadithiophene tetraoxide moiety of formula (10), a thienothiophene moiety of formula (11), a thienothiophene tetraoxide moiety of formula (12), a dithienothiophene moiety of formula (13), a dithienothiophene dioxide moiety of formula (14), a dithienothiophene tetraoxide moiety of formula (15), a tetrahydroisoindole moiety of formula (16), a thienothiophene dioxide moiety of formula (17), a dithienothiophene dioxide moiety of formula (18), a fluorene moiety of formula (19), a silole moiety of formula (20), a cyclopentadithiophene moiety of formula (21), a fluorenone moiety of formula (22), a thiazole moiety of formula (23), a selenophene moiety of formula (24), a thiazolothiazole moiety of formula (25), a cyclopentadithiazole moiety of formula (26), a naphthothiadiazole moiety of formula (27), a thienopyrazine moiety of formula (28), a silacyclopentadithiophene moiety of formula (29), an oxazole moiety of formula (30), an imidazole moiety of formula (31), a pyrimidine moiety of formula (32), a benzoxazole moiety of formula (33), or a benzimidazole moiety of formula (34):

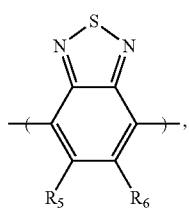
(2)

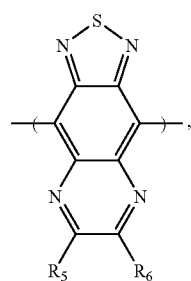
(3)

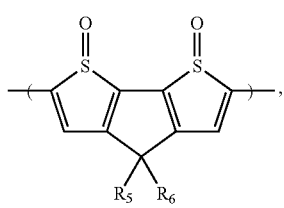
(4)

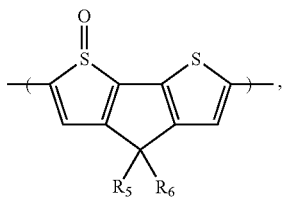
(5)

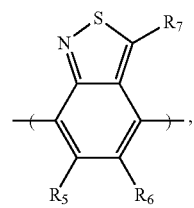
(6)

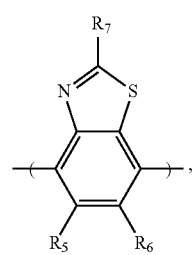
(7)

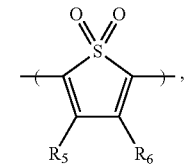
(8)

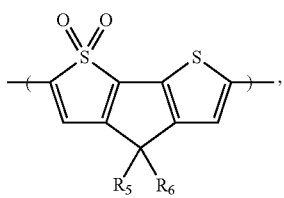
(9)

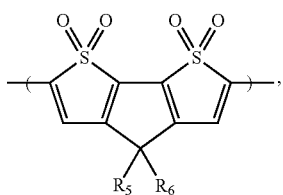
(10)

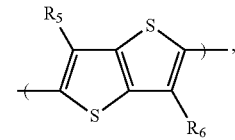
(11)

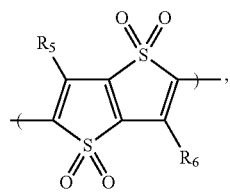
(12)

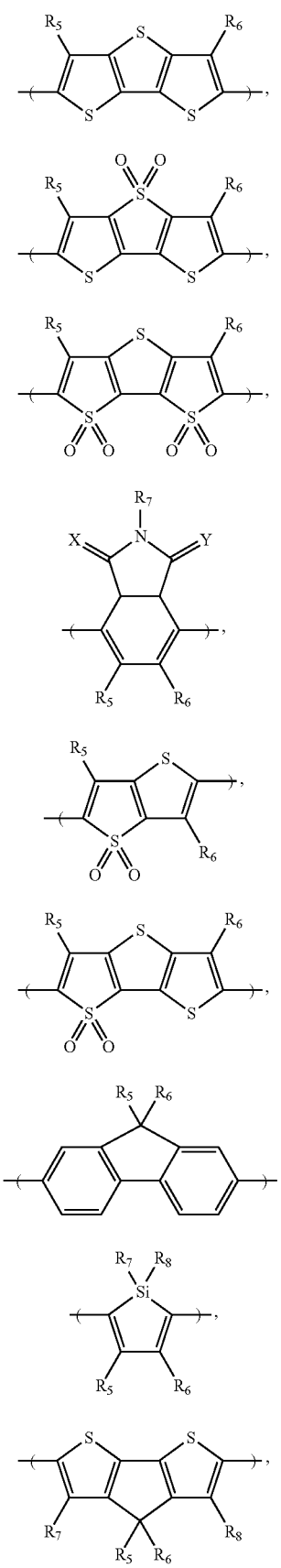
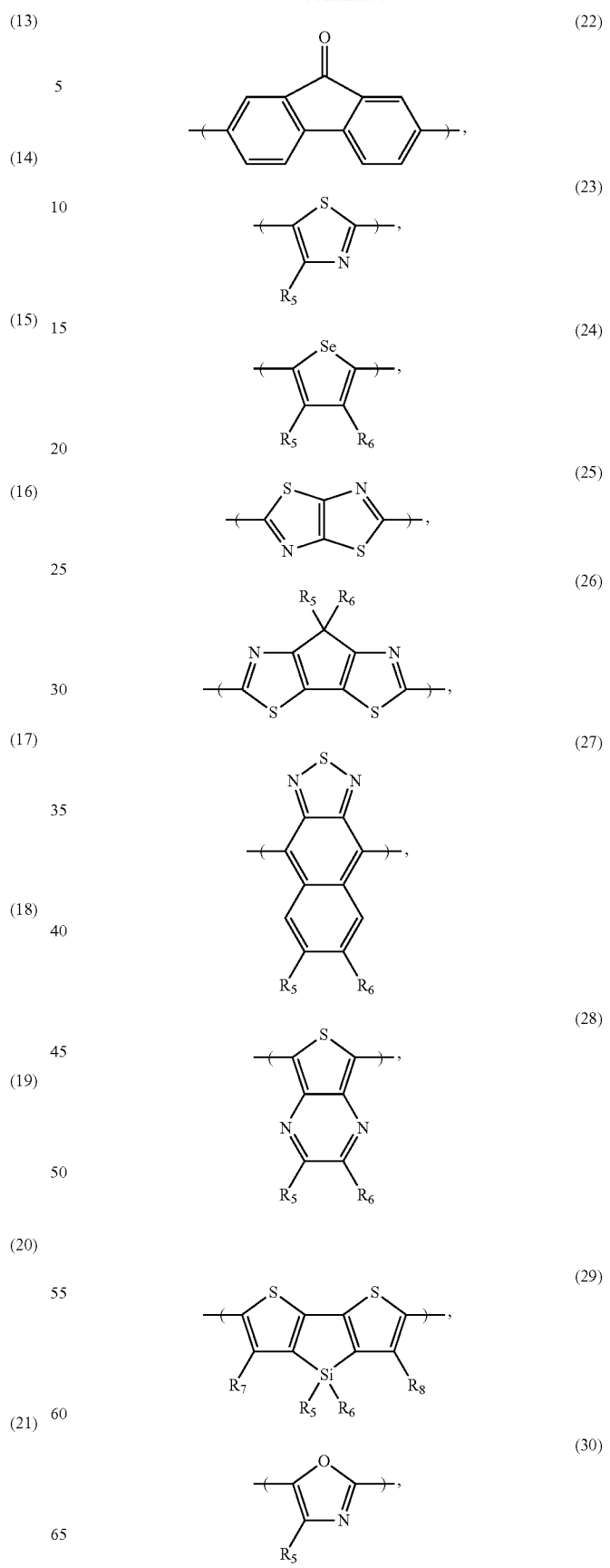

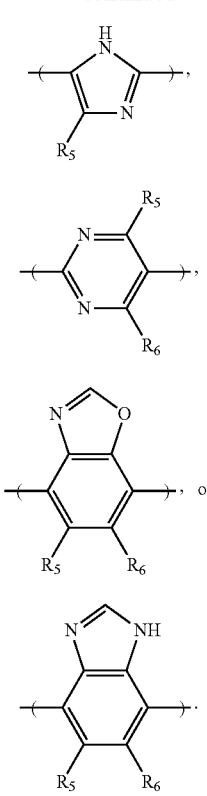

in which each of X and Y, independently, is $CH_2$, O, or S; each of $R_5$ and $R_6$, independently, is H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$, in which R can be H, alkyl, $C_1$-$C_{20}$ alkoxy, aryl, heteroaryl, $C_3$-$C_{20}$ cycloalkyl, or $C_1$-$C_{20}$ heterocycloalkyl; and each of $R_7$ and $R_8$, independently, is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl.

44. The system of claim 43, wherein the second comonomer repeat unit comprises a benzothiadiazole moiety of formula (2) or a thiazolothiazole moiety of formula (25).

45. A system, comprising:
first and second electrodes; a hole carrier layer comprising a hole carrier material;
a first photoactive layer comprising a first organic electron donor material and a first organic electron acceptor material;
a third layer comprising an n-type semiconductor material;
a fifth layer comprising a semiconductive material or an electrically conductive material;
a fourth layer comprising a p-type semiconductor material;
a second photoactive layer comprising a second organic electron donor material and a second organic electron acceptor material; and
a hole blocking material comprising a hole blocking material;
wherein the hole carrier layer is between the first electrode and the first photoactive layer;
the first photoactive layer is between the hole carrier layer and the third layer;
the third layer is between the first photoactive layer and the fifth layer;
the fifth layer is between the third layer and the fourth layer;
the fourth layer is between the fifth layer and the second photoactive layer;
the second photoactive layer is between the fourth layer and the hole blocking layer;
the hole blocking layer is between the second photoactive layer and the second electrode;
each of the hole carrier material, the hole blocking material, the n-type semiconductor, and the p-type semiconductor is different from each of the first and second organic electron donor and acceptor materials;
at least one of the first and second photoactive layers has a thickness of at least about 0.05 micron;
at least one of the first and second organic electron donor materials comprises a polysilacyclopentadithiophene copolymer;
the polysilacyclopentadithiophene copolymer comprises a first comonomer repeat unit and a second comonomer repeat unit different from the first comonomer repeat unit, the first comonomer repeat unit comprises a silacyclopentadithiophene moiety, and the second comonomer repeat unit comprises a benzothiadiazole moiety, a thiadiazoloquinoaline moiety, a cyclopentadithiophene oxide moiety, a benzoisothiazole moiety, a benzothiazole moiety, a thiophene oxide moiety, a thienothiophene moiety, a thienothiophene oxide moiety, a dithienothiophene moiety, a dithienothiophene oxide moiety, a tetrahydroisoindole moiety, a fluorene moiety, a silole moiety, a cyclopentadithiophene moiety, a fluorenone moiety, a thiazole moiety, a selenophene moiety, a thiazolothiazole moiety, a cyclopentadithiazole moiety, a naphthothiadiazole moiety, a thienopyrazine moiety, a silacyclopentadithiophene moiety, an oxazole moiety, an imidazole moiety, a pyrimidine moiety, a benzoxazole moiety, or a benzimidazole moiety; and
the system is configured as a photovoltaic system.

46. The system of claim 45, wherein at least one of the first and second organic electron donor materials comprises poly (silacyclopentadithiophene-co-benzothiadiazole).

* * * * *

UNITED STATES PATENT AND TRADEMARK OFFICE
CERTIFICATE OF CORRECTION

PATENT NO. : 8,158,881 B2
APPLICATION NO. : 11/734093
DATED : April 17, 2012
INVENTOR(S) : Christoph Josef Brabec, Russell Gaudiana and Christoph Waldauf It is certified that error appears in the above-identified patent and that said Letters Patent is hereby corrected as shown below:

Column 47, Line 55-56
In Claim 1, delete "eyclopentadithiophene" and insert -- cyclopentadithiophene -- therefor.

Column 51, Line 20 (Approx.)

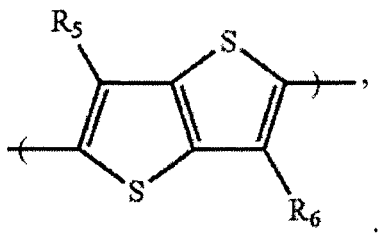

In Claim 21, add -- (11) -- after

Column 54, Line 44-45
In Claim 34, delete "eyclopentadithiophene" and insert -- cyclopentadithiophene -- therefor.

Column 56, Line 55 (Approx.)

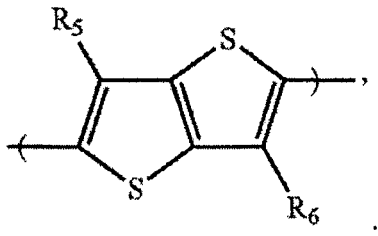

In Claim 43, add -- (11) -- after

Column 59, Line 38 (Approx.)
In Claim 43, delete "alkyl" and insert -- $C_1$-$C_{20}$ alkyl -- therefor.

Column 60, Line 42
In Claim 45, delete "eyclopentadithiophene" and insert -- cyclopentadithiophene -- therefor.

Signed and Sealed this
Third Day of July, 2012

David J. Kappos
*Director of the United States Patent and Trademark Office*